United States Patent [19]

Matsumoto et al.

[11] Patent Number: 5,703,888
[45] Date of Patent: Dec. 30, 1997

[54] METHOD FOR CHECKING A RELOADABLE MEMORY, MEMORY CHECKING DEVICE, AND AUTOMATIC DATA RESTORING DEVICE

[75] Inventors: Masashi Matsumoto; Yasushi Saito; Takao Ichihashi; Shuji Yamada, all of Osaka, Japan

[73] Assignee: Mita Industrial Co., Ltd., Osaka-fu, Japan

[21] Appl. No.: 685,325

[22] Filed: Jul. 23, 1996

Related U.S. Application Data

[63] Continuation of Ser. No. 234,774, Apr. 28, 1994, abandoned.

[30] Foreign Application Priority Data

May 10, 1993 [JP] Japan ................................. 5-108600

[51] Int. Cl.$^6$ ........................................................ G06F 11/08
[52] U.S. Cl. ................................................................ 371/51.1
[58] Field of Search ................................ 371/21.2, 40.1, 371/10.2, 51.1

[56] References Cited

U.S. PATENT DOCUMENTS

| | | | |
|---|---|---|---|
| 4,819,159 | 4/1989 | Shipley et al. | 395/182.17 |
| 4,980,888 | 12/1990 | Bruce et al. | 371/21.1 |
| 5,255,270 | 10/1993 | Yanai et al. | 371/10.2 |
| 5,446,741 | 8/1995 | Boldt et al. | 371/21.1 |
| 5,555,249 | 9/1996 | Hilley et al. | 371/21.1 |

FOREIGN PATENT DOCUMENTS

| | | |
|---|---|---|
| 3-171343 | 7/1991 | Japan. |
| 3-171349 | 7/1991 | Japan. |

*Primary Examiner*—Stephen M Baker
*Attorney, Agent, or Firm*—Jordan and Hamburg

[57] ABSTRACT

A checking method for checking a reloadable memory includes writing operative data in connection with a specified operation on a first portion of the reloadable memory and check data on a second portion of the reloadable memory; reading data from the second portion after writing the operative data and the check data on the reloadable memory; and judging whether the read data agrees with the written check data. A checking device for checking a reloadable memory includes a reader for reading data from a specified portion of the memory after reloading operative data and writing a check data; and a judger for judging whether the read data agrees with the check data.

5 Claims, 21 Drawing Sheets

| ADDRESS | 00 01 02 03 04 05 06 07 08 09 0A 0B 0C 0D 0E 0F |
|---|---|
| 2FF00H | 42 49 52 54 48 44 41 59 21 2A 2A 2A 19 67 12 25 |
| 2FF10H | 3C 53 41 49 54 4F 55 00 59 41 53 55 53 48 49 3E |
| ⋮ | -------------------------------- |
|  | -------------------------------- |
| 2FFE0H | 00 73 61 69 44 65 75 00 79 61 73 75 73 68 69 00 |
| 2FFF0H | 4D 49 54 41 4B F4 55 47 59 4F 55 00 4B 4B 00 00 |

| ADDRESS | 00 01 02 03 04 05 06 07 08 09 0A 0B 0C 0D 0E 0F |
|---|---|
| 3A000H | 42 49 52 54 48 44 41 59 21 2A 2A 2A 19 67 12 25 |
| 3A010H | 3C 53 41 49 54 4F 55 00 59 41 53 55 53 48 49 3E |
| ⋮ | -------------------------------- |
|  | -------------------------------- |
| 3A0E0H | 00 73 61 69 44 65 75 00 79 61 73 75 73 68 69 00 |
| 3A0F0H | 4D 49 54 41 4B F4 55 47 59 4F 55 00 4B 4B 00 00 |

| ADDRESS | 00 01 02 03 04 05 06 07 08 09 0A 0B 0C 0D 0E 0F |
|---|---|
| 2FF00H | 3C 53 41 49 54 4F 55 00 59 41 53 55 53 48 49 3E |

| ADDRESS | 00 01 02 03 04 05 06 07 08 09 0A 0B 0C 0D 0E 0F |
|---|---|
| 32000H | 3C 53 41 49 54 4F 55 00 59 41 53 55 53 48 49 3E |
| 3A000H | 3C 53 41 49 54 4F 55 00 59 41 53 55 53 48 49 3E |

| ADDRESS | 00 01 02 03 04 05 06 07 08 09 0A 0B 0C 0D 0E 0F |
|---|---|
| 3A000H | 00 01 02 03 04 05 06 07 08 09 0A 0B 0C 0D 0E 0F |
| 3A010H | 10 11 12 13 14 15 16 17 18 19 1A 1B 1C 1D 1E 1F |
| 3A020H | 20 21 22 23 24 25 26 27 28 29 2A 2B 2C 2D 2E 2F |
| ⋮ | — — — — — — — — — — — — — — — — |
|  | — — — — — — — — — — — — — — — — |
| 3A0D0H | D0 D1 D2 D3 D4 D5 D6 D7 D8 D9 DA DB DC DD DE DF |
| 3A0E0H | E0 E1 E2 E3 E4 E5 E6 E7 E8 E9 EA EB EC ED EE EF |
| 3A0F0H | F0 F1 F2 F3 F4 F5 F6 F7 F8 F9 FA FB FC FD FE FF |

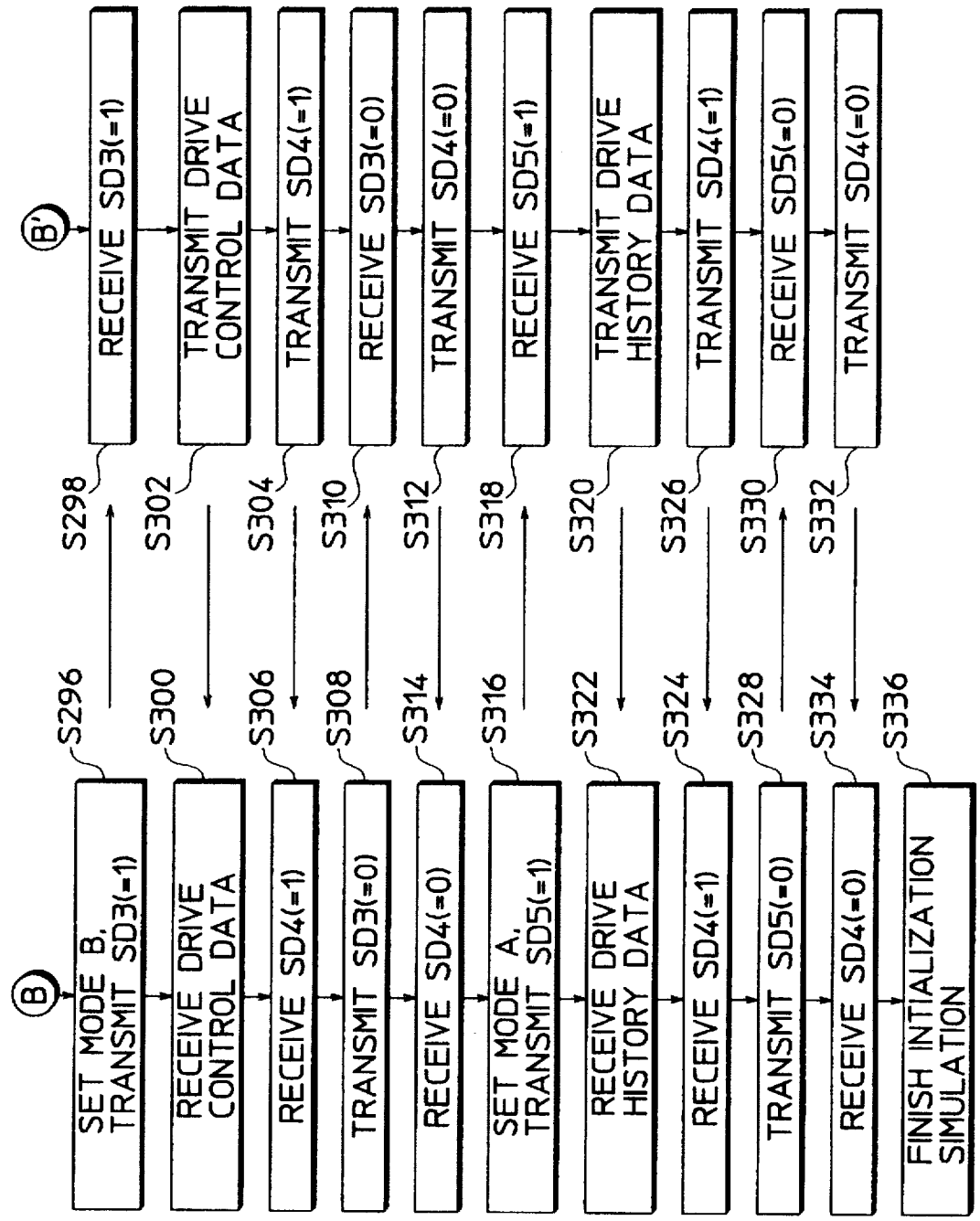

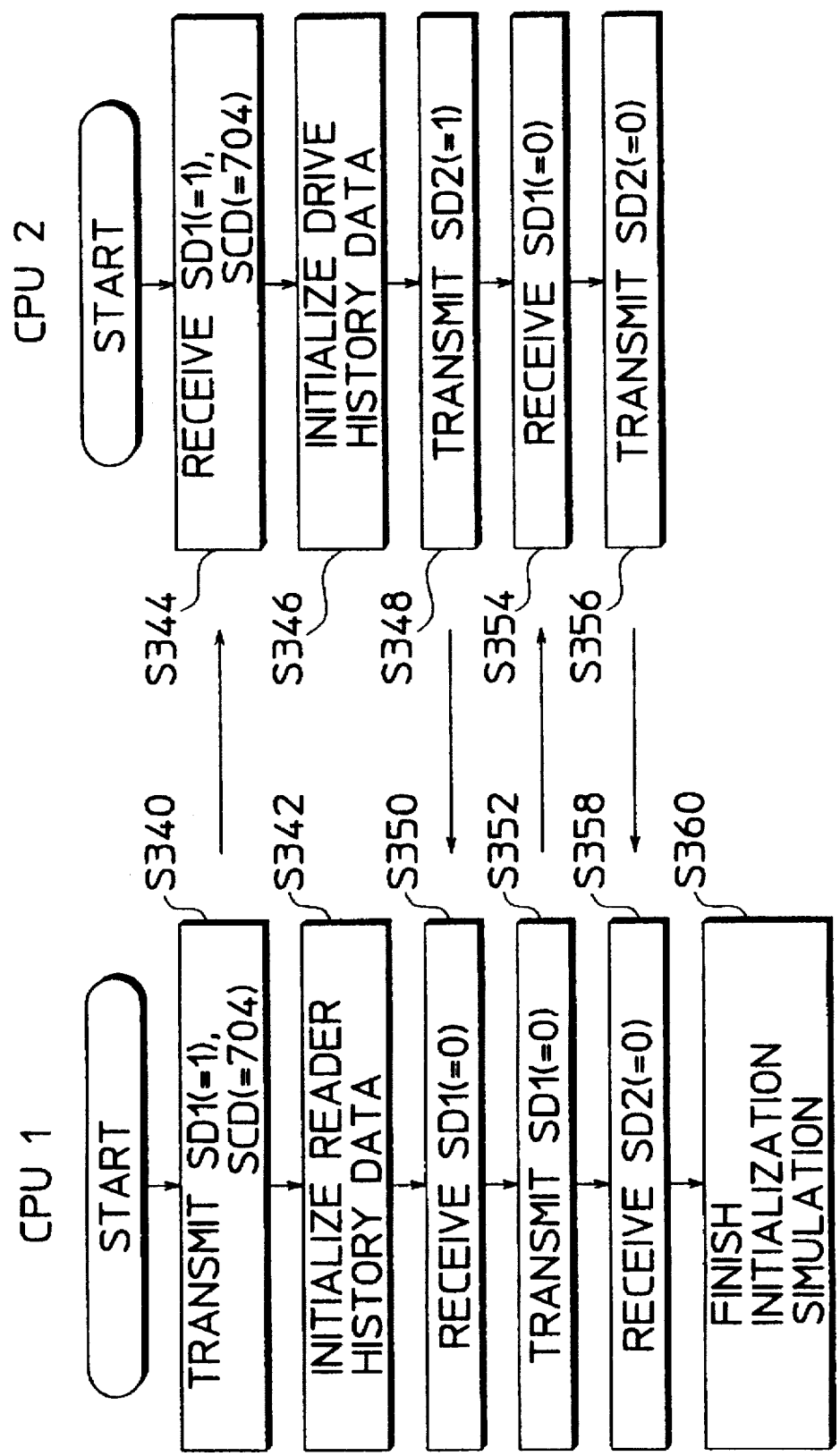

METHOD FOR CHECKING A RELOADABLE MEMORY, MEMORY CHECKING DEVICE, AND AUTOMATIC DATA RESTORING DEVICE

This application is a continuation of application Ser. No. 08/234,774, filed Apr. 28, 1994, now abandoned.

BACKGROUND OF THE INVENTION

This invention relates to a method for checking a reloadable memory such as a DRAM (dynamic random access memory) and a SRAM (static random access memory), a memory checking device, and an automatic data restoring device including the memory checking device.

A control system which uses a reloadable memory such as a DRAM and a SRAM (hereinafter referred to merely as a RAM) as a storage means for an operation processing has been known to include a memory checking device for checking for abnormality in the RAM.

For example, Japanese Unexamined Patent Publication No. 3-171343 discloses a memory checking device. Specified data to be checked (cheek data) corresponding to memory check levels are preset in this checking device. When the RAM is initialized, the checking device writes the preset check data in an entire storage region of the RAM. Thereafter, the checking device checks the RAM by reading the written check data and judging whether the read check data agree with the written check data. This checking device is designed to shorten the checking time by classifying all the check data according to their memory check levels and checking the memory using a part of the check data corresponding to the memory check level.

Further, Japanese Unexamined Patent Publication No. 3-171349 discloses a memory checking device for use in a data processor including a plurality of RAMs. This checking device writes and reads check data on and from a selected number of RAMs to check the RAMs in an idle time during the initialization or data processing, which shortens the checking time in each memory check.

In each memory check, this checking device writes a specified check data in an entire storage region of the RAM to be checked. Thereafter, the checking device reads the written check data and judges whether the read check data agree with the written check data so as to check whether this RAM functions normally.

Each one of the memory checking devices disclosed in the aforementioned publications is designed to check whether the RAM functions normally in a static state during the initialization, within a shorter period of time and more efficiently. These devices are not designed to check the RAM in a dynamic state, i.e., to check whether an abnormality has occurred while the RAM is driven.

There are two possible types of abnormalities in the RAM: one which causes damage in the RAM itself, and the other which causes no damage in the RAM, but causes a change in the data stored therein due to a variation in a back-up power supply, an overcurrent resulting from the electrostatics, and the like occurring while the RAM is driven. The phenomenon caused by the latter abnormality is called a data distortion. Since the conventional memory checking method is to check the RAM in the static state, it is normally judged that the RAM itself has been damaged when the abnormality of the RAM is detected, and a maintenance is conducted to replace the RAM or the like.

The abnormality of the RAM occurred while the RAM is driven may result in the data distortion. In this case, the control device can be brought back to a proper operative state only by restoring the distorted data in the RAM. Thus, the abnormality does not necessarily require a cumbersome operation such as the replacement of the RAM.

Some control systems are constructed such that an operation block for controlling input and output of various information and a drive block for controlling the actual driving of the control system based on the information received from the operation block are connected to enable a data communication therebetween; data required for each block to execute a control is backed up in a RAM provided in the other block so that, even if the abnormality occurs in the RAM of one block, the data stored in the RAM of the one block can be restored based on the back-up data stored in the RAM of the other block. In consideration of the possibility of using effectively the data mutually backed up by the RAMs and avoiding an inoperative state of the control system due to the maintenance, it is particularly desirable for these control systems to check the RAM while the control system is in operation and to, in the event of the abnormality, judge that the abnormality has resulted in the data distortion and restore the data stored in the RAM automatically.

However, with the conventional memory checking methods, even if an abnormality occurs in the RAM of one block while the control system is in operation, such an abnormality cannot be detected immediately. Thus, the data mutually backed up by the RAMs cannot be used effectively and the abnormality may possibly become even worse.

SUMMARY OF THE INVENTION

It is an object of the invention to provide a reloadable memory checking method and device, and a data restoring device which have overcome the above-mentioned problems residing in the prior art.

It is another object of the invention to provide a reloadable memory checking method and device which make it possible to detect promptly an abnormality occurred therein while a host equipment is in operation, and an automatic data restoring device which can restore a distorted data in the event of a data distortion.

The invention is directed to a method for checking a reloadable memory comprising the steps of: writing operative data in connection with a specified operation on a first portion of the reloadable memory and check data on a second portion of the reloadable memory; reading data from the second portion after writing the operative data and the check data on the reloadable memory; and judging whether the read data agrees with the written check data.

Also, the invention is directed to a device for checking a memory reloadable with operative data in connection with a specified operation, the device comprising: check data generator means for generating check data; writing means for writing the check data on a specified portion of the memory each time the memory is reloaded with operative data; reading means for reading data from the specified portion of the memory after the reloading of operative data and the writing of the check data; and judge means for judging whether the read data agrees with the generated check data.

The check data generator means may be provided with a memory for storing predetermined check data. Also, the check data generator means may be provided with means for generating check data on the basis of the address of the specified portion that stores with the check data.

The reading means may be provided with means for judging whether a predetermined step of the specified operation is completed to thereby execute the reading of data from the specified portion of the memory after the predetermined step is completed.

The reading means may be provided with timer means for measuring a predetermined time after the reloading of operative data and writing of the check data to thereby execute the reading of data from the specified portion of the memory after the lapse of the predetermined time.

Further, the invention is directed to a device for restoring operative data in connection with a specified operation on a reloadable memory, the device comprising: storage means for storing the operative data for back-up; writing means for writing check data on a specified portion of the memory each time the memory is reloaded with operative data; reading means for reading data from the specified portion of the memory after the reloading of operative data and the writing of the check data; judge means for judging whether the read data agrees with the check data; and transfer means for reading the operative data from the storage means and writing the operative data on another specified portion of the memory when the read data is judged to disagree with the check data.

According to the invention, a reloadable memory is provided with a portion to be written with check data. The check data is written each time the memory is loaded with operative data. Thereafter, the written check data is read at a specified time, and the judging of whether the read data agrees with the written check data is executed to detect an occurrence of abnormality in the memory.

Specifically, when the read data is judged to agree with the written check data, no abnormality is determined to occur in the memory. On the other hand, when the read data is judged to disagree with the written check data, an abnormality is determined to occur in the memory.

Also, each time the memory is reloaded with the operative data, check data is written on a specified portion of the reloadable memory. The check data is stored in the memory in advance or generated on the basis of the address of the specified portion of the reloadable memory. The check data is read from the reloadable memory after a predetermined step of the specified operation is completed. Alternatively, the check data is read after the lapse of a predetermined time from the reloading of operative data.

Also, the checking device is connected with the storage means for storing the operative data for back-up and to the transfer means for reading the operative data from the storage means and writing the operative data on another specified portion of the memory when the judge means judges that the read data disagrees with the check data.

The above and other objects, features and advantages of the present invention will become more apparent upon a reading of the following detailed description and drawings.

BRIEF DESCRIPTION OF THE DRAWINGS

FIGS. 13A, 13B, 13C are diagrams showing a third embodiment according to which a CPU writes check data in the RAM, FIG. 13A showing a storage region for the check data in the virtual memory space, FIG. 13B showing an example of check data stored in a ROM region, and FIG. 13C showing a state in which the above check data are stored in a check area of a RAM region;

FIGS. 19, 20 are flow charts showing an initialization simulation control using a simulation code "703"; and FIG. 21 is a flow chart showing an initialization simulation control using a simulation code "704".

DETAILED DESCRIPTION OF THE PREFERRED EMBODIMENTS OF THE INVENTION

Hereafter, the invention will be described, taking a digital image forming apparatus as an example.

Figure 1:
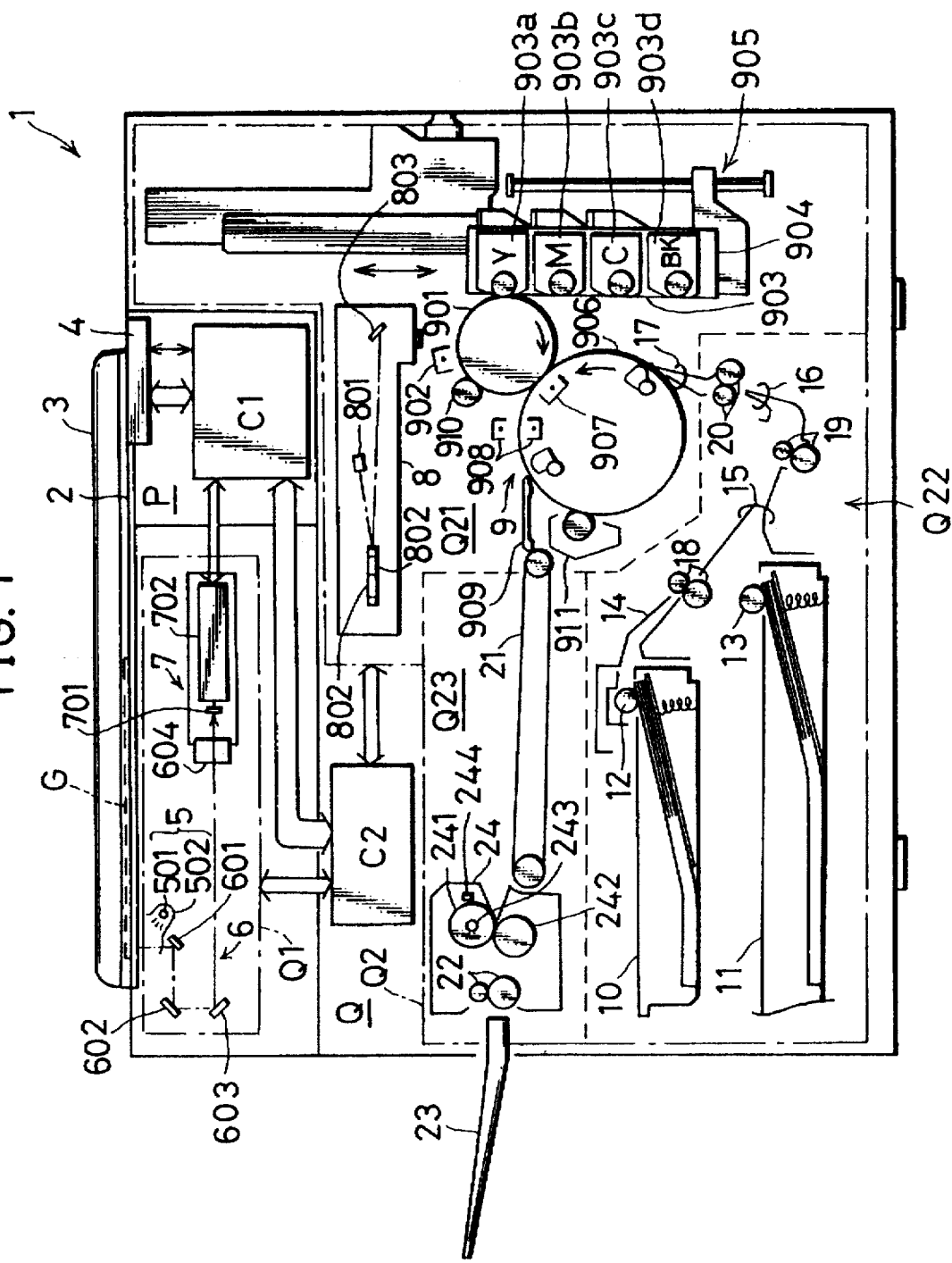
FIG. 1 is a schematic construction diagram showing a color digital copying machine as an embodiment of the invention.

FIG. 1 is a schematic construction diagram showing a color digital copying machine (digital image forming apparatus) 1 as an embodiment of the invention.

The copying machine 1 is provided with a transparent document platen 2, a document holder 3 and an operation panel 4 at an upper portion thereof, and an imaging mechanism including an operation control block P and a drive control block Q inside a main body thereof. Cassettes 10, 11 are detachably attachable to a lower left part of the interior of the main body.

The operation control block P and the drive control block Q are mutually independent function blocks, and their functional operations are controlled by an operation controller C1 and a drive controller C2, each including a microcomputer, provided in the respective blocks. The controllers C1, C2 are connected with each other so as to conduct a serial data communication therebetween, and fulfill, a composite functional operation; a document is copied by uniting the operation control block P and the drive control block Q systematically through the communication of the information necessary at each end.

The operation control block P controls input and output of the information necessary for a copying operation in the operation panel 4 and controls the serial data communication with the drive control block Q.

Figure 5:
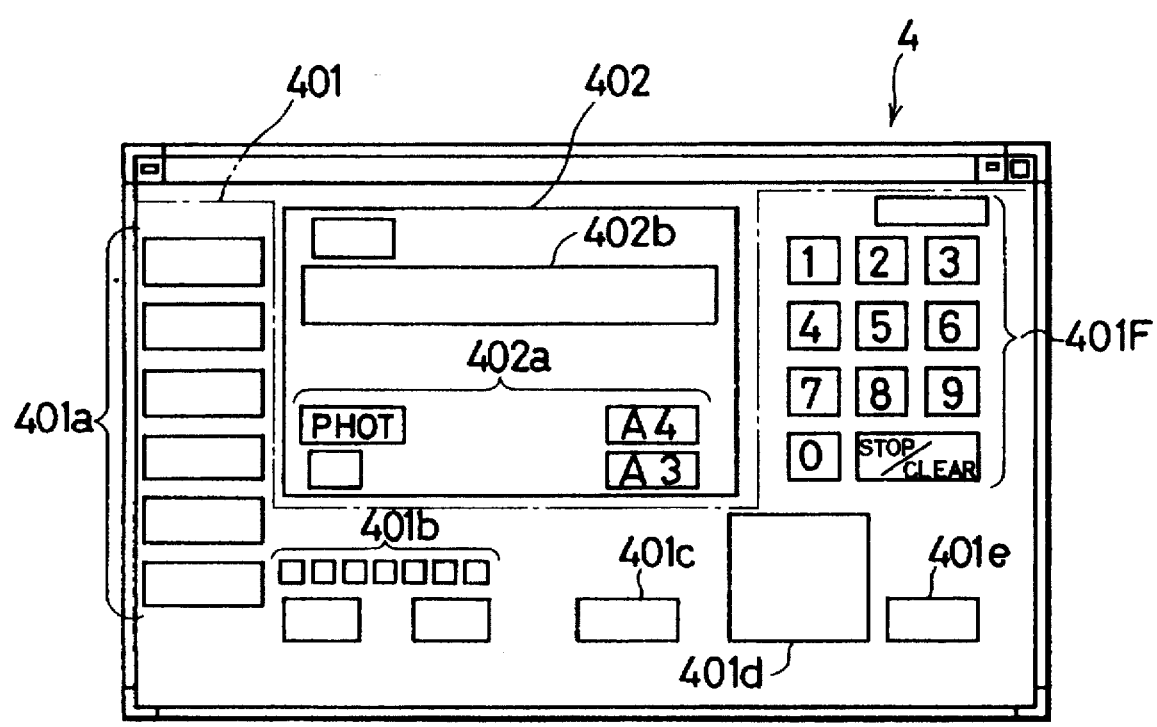
FIG. 5 is a plan view showing the details of an operation panel.

FIG. 5 is a plan view showing the details of the operation panel 4.

The operation panel 4 is provided with a key unit 401 including keys which are operated to input various imaging conditions, and an LCD unit 402 including an LCD (liquid crystal display) for displaying various messages and copying conditions.

The key unit 401 includes a mode setting key 401a for setting various copy modes, an exposure key 401b for setting an exposure level, a cassette key 401c for selecting the size of a copy sheet, a copy key 401d for designating a copying operation, a result key 401e for resetting an inputted condition, a key arrangement 401f for setting and resetting the number of copies to be made and the like.

The LCD unit 402 includes a fixed information display section 402a for displaying a fixed information such as the size of the copy sheet and a message display section 402b for displaying a suitable message as a character information according to an operated state of the copying machine.

Referring back to FIG. 1, the drive control block Q includes an image reader Q1 for reading image information of a document G placed at a specified position on the document platen 2 and an imaging assembly Q2 for forming an image of the document G on a copy sheet using the image information read by the image reader Q1. The image reader Q1 is provided below the document platen 2 and the imaging assembly Q2 is provided below the image reader Q1.

The image reader Q1 is provided with a light source unit 5 for emitting a light onto the document G, a focusing unit 6 for introducing a light image of the document G to an image pick-up unit 7, and the unit 7 for reading the received light image by converting it photoelectrically into an image signal. The light source unit 5 includes a halogen lamp 501 and a reflecting plate 502. The focusing device 6 includes reflection mirrors 601, 602, 603 and a lens 604. The image pick-up unit 7 includes a solid state image pick-up device 701 having, for example, a CCD image sensor (hereinafter referred to as a CCD 701) and an image processor 702 for applying a specified image processing to the image signal read by the CCD 701.

The CCD 701 is, for example, a line sensor including three CCD image sensors, each having color filters of red (R), green (G) and blue (B), which separate the read image signal into color image signals of R, G, B and outputs the same. The image processor 702 includes a page memory having a capacity of storing 4 pages. The image processor 702 converts the respective color image signals of R, G, B read by the CCD 701 into color image signals of cyan (C), yellow (Y), magenta (M) and black (BK) and stores thus generated signals in the page memory.

When the reading of the document image is designated by the drive controller C2, the image reader Q1 illuminates the document G by causing the halogen lamp 501 to emit a light and causes the light source unit 5 and the focusing unit 6 to move in a sub-scanning direction (a transverse direction in FIG. 1) to read the image of the document G.

More specifically, the light emitted from the halogen lamp 501 is reflected by the document G and introduced through the reflection mirrors 601 to 603 to the image pick-up unit 7, in which the reflected light is gathered as much as possible and directed to a sensing surface of the CCD 701 through the lens 604. The light image of the document G is formed on the sensing surface of the CCD 701 by moving the light source unit 5 and the focusing unit 6 in the sub-scanning direction, and thus formed light image is converted photoelectrically into an image signal by the CCD 701. The image signal is read in and out of the CCD 701 controllably in synchronism with the scanning of the light source unit 5 and the focusing unit 6. The image signal representing the image of the document G is read by the line.

The imaging assembly Q2 is provided with an imaging unit Q21 for forming the image of the document G on a copy sheet, a feeding unit Q22 for feeding copy sheets from cassettes 10, 11 to the imaging unit Q21, and a discharge unit Q23 for discharging the copy sheet bearing the image.

The imaging unit Q21 includes an image data output device 8 for outputting the image data and an imaging device 9 for forming and transferring the image to the copy sheet based on the image data outputted from the output device 8.

The output device 8 includes a laser emitter 801 for emitting a laser beam modulated with the image data, a polygonal mirror 802, and a reflection mirror 803. The polygonal mirror 802 directs the laser beam emitted from the laser emitter 801 in a main scanning direction, so that the laser beam scans the circumferential surface of a photosensitive drum 901 in a direction parallel with a shaft of the drum 901. The reflection mirror 803 introduces the laser beam to an exposure position of the drum 901.

The imaging device 9 includes the photosensitive drum 901, a main charger 902, a developing device 903, and a transfer drum 906. A toner image of the document G to be transferred to the copy sheet is formed on the drum 901 based on the image data. The charger 902 charges the surface of the drum 901 to have a specified surface potential, so that a latent image of the document G can be formed thereon. The developing device 903 develops the latent image formed on the drum 901 into a toner image. The transfer drum 906 transports the copy sheet to the drum 901 so that the toner image of the document G can be transferred thereto.

A transfer device 907 is provided inside the transfer drum 906 at a position opposed to the photosensitive drum 901. Separating devices 908 for separating the copy sheet from the drum 901 after the image is transferred to the copy sheet are provided inside and outside the drum 906 and downstream from the transfer device 907. Downstream from the separating devices 908 is provided a separating claw 909. Indicated at 910, 911 are cleaners for cleaning the toner remaining on the drums 901, 906, respectively.

The developing device 903 includes four containers 903a, 903b, 903c, 903d arranged vertically. The respective containers 903a to 903d contain four different color developing agents of yellow (Y), magenta (M), cyan (C) and black (BK) in this order from the uppermost one. These containers 903a to 903d are arranged in a frame 904 movable upward and downward through an elevating mechanism 905, and are brought to the position opposed to the photosensitive drum 901 one after another according to the elevating movement of the frame 904.

The transfer drum 906 is driven by, for example, a gear mechanism (not shown) so as to rotate together with the photosensitive drum 901 at the same speed as and in the opposite direction from the drum 901. The drum 906 feeds the copy sheet fed from the feeding unit Q22 while attracting the same electrostatically at its circumferential surface and causes the toner image formed on the drum 901 to be transferred to the copy sheet.

The feeding unit Q22 includes feed rollers disposed respectively at upper leading positions of the cassettes 10, 11, guide plates 14, 15, 16, 17 for guiding the copy sheets from the cassettes 10, 11 to the transfer drum 906, pairs of transport rollers 18, 19 disposed at desirable intermediate positions of the guide plates 14 to 17, and a pair of registration rollers 20.

The cassettes 10, 11 have each, for example, a magnetic code indicative of a cassette size (i.e., sheet size) at a specified position. When these cassettes are attached to the copying machine, the coded information is read into the drive controller C2.

The discharge unit Q23 includes a transport belt 21, a pair of discharge rollers 22, and a discharge tray 23. Between the transport belt 21 and the discharge roller pair 22, there is provided a fixing device 24 for fixing the transferred document image to the copy sheet. The fixing device 24 includes a heating roller 241 and a pressing roller 242. A fixing heater 243 and a temperature sensor 244 are provided at suitable positions in the heating roller 241. The sensor 244 detects the temperature at the circumferential surface of the heating roller 241.

Here, the copying operation will be described. The photosensitive drum 901 is drivingly rotated at a specified speed. After being charged by the main charger 902 to have a specified surface potential, the charged surface of the drum 901 is brought to a position at which the laser beam is directed. The laser beam raster-scans relatively the drum surface according to the rotation of the drum 901 and the surface potential of the drum 901 changes according to the illuminance of the laser beam, thereby forming a latent image of the document G on the drum surface.

Charged toner supplied from the developing device 903 is attracted electrostatically to this latent image, thereby forming a toner image, which is brought into pressing contact with and transferred to the copy sheet transferred by the transfer drum 906.

The above imaging operation is repeated four times for the image data of the respective colors of Y, M, C, BK. Upon the completion of the imaging operation for the image data of BK, the copy sheet attracted electrostatically on the circumferential surface of the transfer roller 906 is separated from the drum 906 by the separating devices 908 and the separating claw 909. The copy sheet is transferred by the transport belt 21 to the fixing device 24, in which the toner image is fixed to the copy sheet. Consequently, the copy sheet is discharged onto the discharge tray 23 by the discharge roller pair 22.

The operation of reading the image data and that of forming the image of the document G are controlled centrally by the drive controller C2.

Figure 2:
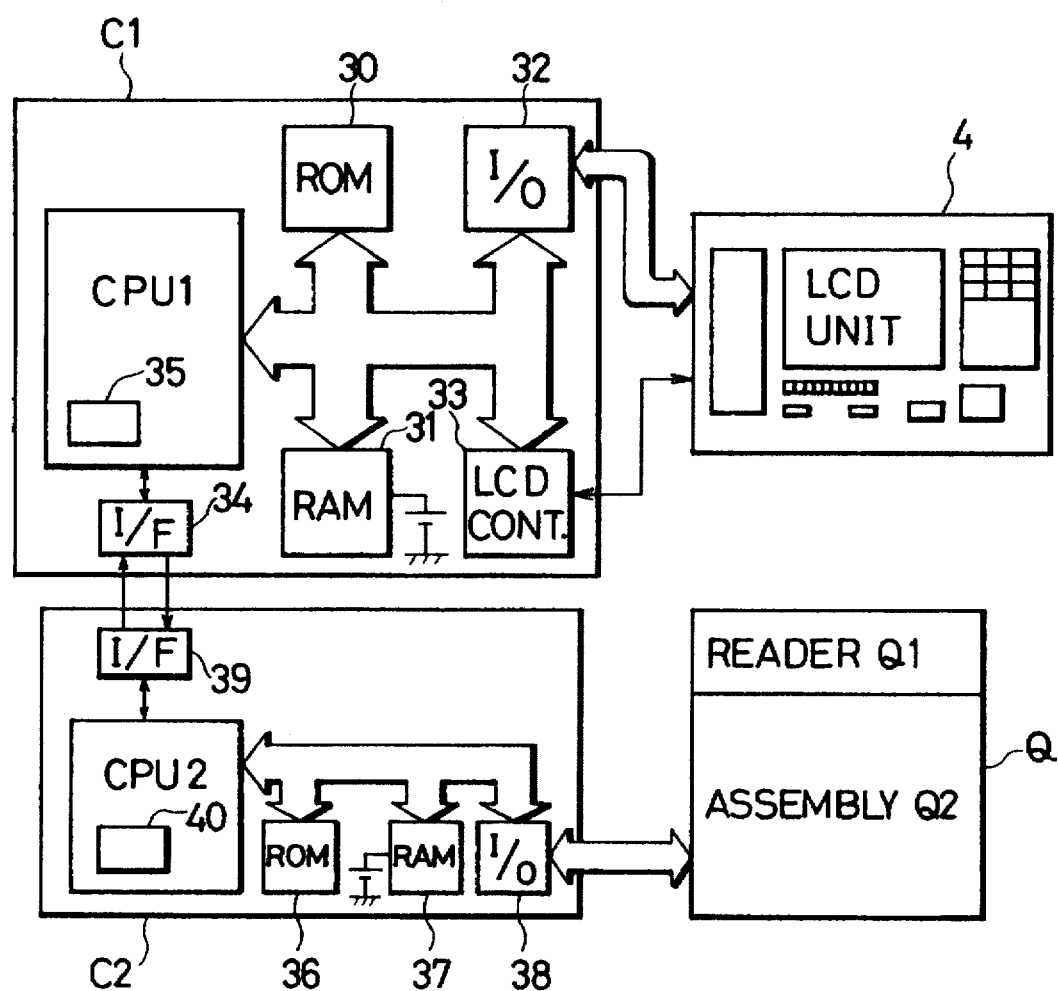
FIG. 2 is a diagram showing a basic construction of an operation controller and a drive controller provided in a color digital copying machine (system unit)

FIG. 2 is a diagram showing a basic construction of the operation and drive controllers C1, C2.

The operation controller C1 is basically provided with a central processing unit (hereinafter referred to as a CPU 1) for controlling the operation of the operation control block P 32, an ROM 30, a RAM 31, an input/output port (I/O port), a LCD controller 33, and an interface (I/F) 34. In the ROM 30 are prestored control programs specifying a procedure of an operation control executed in the operation control block P, a control program such as a procedure of the communication with the drive control block Q, and the like. The RAM 31 stores the information necessary for the CPU 1 to perform a specified processing in accordance with the control program and operation results. The I/O port 32 is adapted to output and input the desired data to and from the operation panel 4. The LCD controller 33 controls the drive of the LCD unit 402 in the operation panel 4. The I/F 34 is adapted to conduct a serial data communication with a central processing unit (CPU 2) provided in the drive controller C2.

Figure 3:
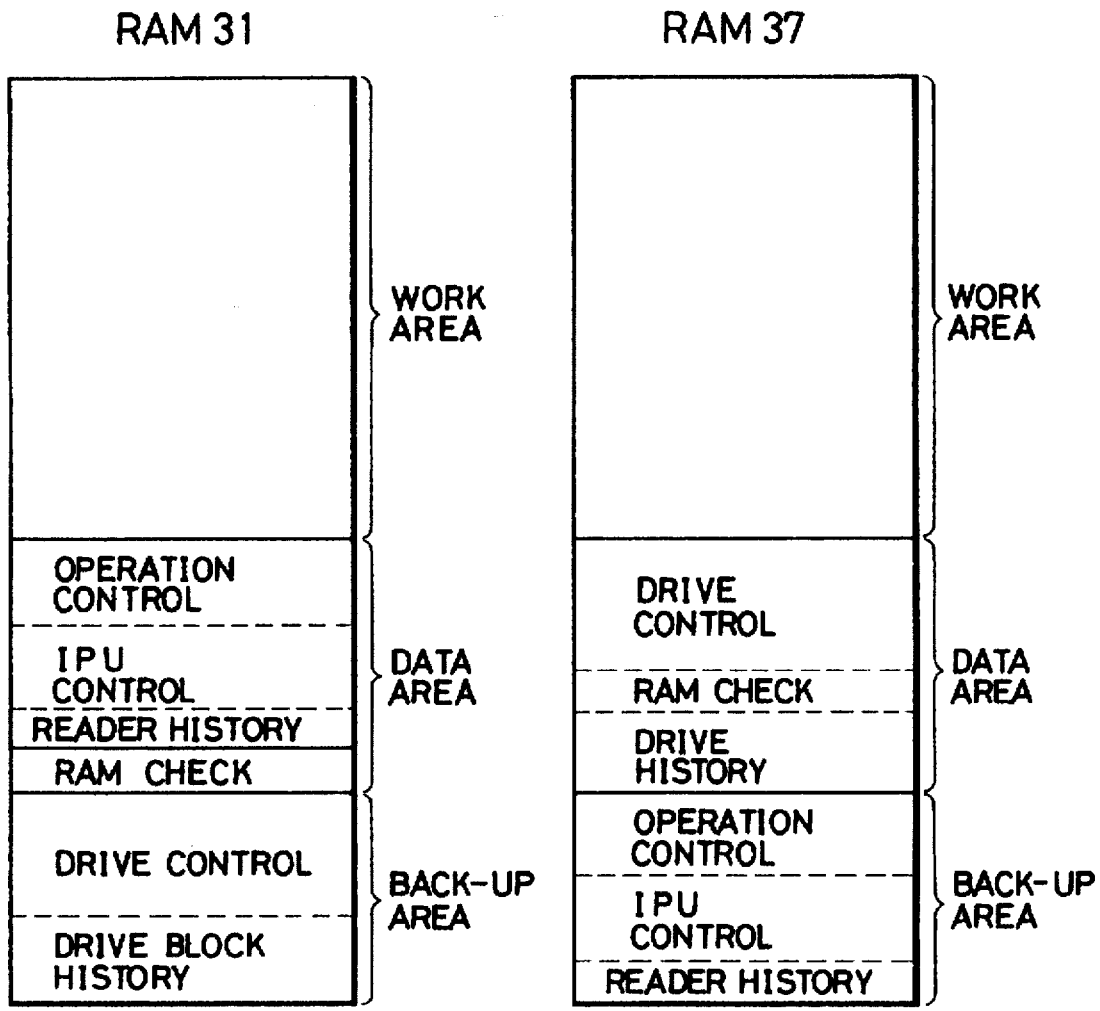
FIGS. 3A, 3B are diagrams showing area constructions of a RAM 31 and a RAM 37 respectively.

Similar to the operation controller C1, the drive controller C2 is provided with the CPU 2 for controlling the operation of the operation control block Q, a ROM 36, a RAM 37, an I/O port 38, and an I/F 39. In the ROM 36 are prestored control programs such as a procedure of an operation control executed in the drive control block Q and a procedure of the communication with the operation control block P. The RAM 37 stores the information necessary for the CPU 2 to execute a specified processing in accordance with the control program and operation results. The I/O port 38 is adapted to output and input the desired data to and from the imaging assembly Q2 and the image reader Q1. The I/F 39 is adapted to conduct a serial data communication with the CPU 1. FIGS. 3A, 3B are diagrams showing area constructions of the RAMs 31, 37 respectively.

A storage region of the RAM 31 is divided into three areas: a work area, a data area, and a back-up area. In the data area are stored various data necessary for the operation controller C1 to execute its processing. In the back-up area are stored data necessary for the drive controller C2 to execute its processing, data representing an operation history, and the like.

Similar to the RAM 31, a storage region of the RAM 37 is also divided into a work area, a data area, and a back-up area. In the data area are stored various data necessary for the drive controller C2 to execute its processing. In the back-up area are stored data necessary for the operation controller C1 to execute its processing, data representing the operation history, and the like.

TABLE-1.1, TABLE-1.2 below show contents of the data stored in the data areas and back-up areas of the RAMs 31, 37.

TABLE 1.1

DATA STORED IN THE RAM 31

NO.

[DATA AREA]

| | | |
|---|---|---|
| (1) | OPERATION CONTROL DATA | SECRET CODE, TABLET CORRECTION DATA, DISPLAY LANGUAGE DATA, SIZE SPEC. (CM SPEC./INCH SPEC.), OTHER DATA NECESSARY FOR A CONTROL OF THE OPERATION CONTROLLER C1 |
| (2) | IPU CONTROL DATA | CONTROL VALUE, CORRECTION VALUE, AND LIKE DATA NECESSARY FOR AN IMAGE READING OPERATION AND IMAGE SIGNAL PROCESSING OF THE IMAGE READER Q1 |
| (3) | OPERATION RAM CHECK DATA | CHECK DATA USED TO CONFIRM AN OCCURRENCE OF ABNORMALITY IN THE RAM 31 |
| (4) | READER HISTORY DATA | DATA REPRESENTING AN OPERATION HISTORY OF THE IMAGE READER Q1 |

[BACK-UP AREA]

TABLE 1.1-continued

DATA STORED IN THE RAM 31

NO.

(5) DRIVE CONTROL BACK-UP DATA / BACK-UP DATA FOR DRIVE CONTROL DATA LISTED IN (1)' OF TABLE 1.2
(6) DRIVE BLOCK HISTORY BACK-UP DATA / BACK-UP DATA FOR HISTORY DATA OF THE DRIVE BLOCK LISTED IN (3)' OF TABLE 1.2

TABLE 1.2

DATA STORED IN THE RAM 37

NO.

[DATA AREA]

(1)' DRIVE CONTROL DATA / DATA USED TO CONTROL ACTUATORS DRIVEN FOR THE IMAGING, SUCH AS DEVELOPMENT CONTROL, DEVELOPMENT CORRECTION, MAIN CHARGER CONTROL, FEED TIMING CONTROL, TEMPERATURE CONTROL
(2)' DRIVE RAM CHECK DATA / CHECK DATA USED TO CONFIRM AN OCCURRENCE OF AN ABNORMALITY IN THE RAM 37
(3)' DRIVE BLOCK HISTORY DATA / DATA REPRESENTING AN IMAGING HISTORY SUCH AS TOTAL DEVELOPING NO., STARTING AGENT REPLACEMENT NO., SHEET FEED NO., TOTAL COPYING NO.

[BACK-UP AREA]

(4)' OPERATION CONTROL BACK-UP DATA / BACK-UP DATA FOR THE OPERATION CONTROL DATA LISTED IN (1) OF TABLE 1.1
(5)' IPU CONTROL BACK-UP DATA / BACK-UP DATA FOR IPU CONTROL DATA LISTED IN (2) OF TABLE 1.1
(6)' READER HISTORY BACK-UP DATA / BACK-UP DATA FOR HISTORY DATA OF THE THE IMAGE READER Q1 LISTED IN (4) OF TABLE 1.1

In order to restore the data promptly and smoothly in the case where the abnormality occurs in either one of the RAMs 31, 37, the data necessary for the controllers C1, C2 to execute their controls, the history data, and other data are backed up in the corresponding RAMs 37, 31 as shown in the above tables. It will be described later how the memory abnormality in the RAMs 31, 37 are checked and the distorted data are restored.

The operation control data and the drive control data are set by carrying out a simulation of a copying operation when the color digital copying machine 1 is manufactured or the maintenance is made. These data are stored in the respective RAMs 31, 37 at the time when the simulation is completed.

The reader history data and the drive block history data are stored each time the copying operation is performed in the copying machine 1, and renewably written in the RAMs 31, 37, for example, every specified number of copying operations or upon the lapse of a specified period.

The RAM check data are preset in the ROMs 30, 36 or determined by performing a specified calculation. When the RAMs 31, 37 are initialized, these data are set in preset addresses of the RAMs 31, 37 after being read from the ROMs 30, 36 or performing the specified calculation. It will be described later how the RAM check data are set.

The CPU 1 is provided internally with a RAM used for the processing (hereinafter referred to as an internal RAM 35).

Figure 4:
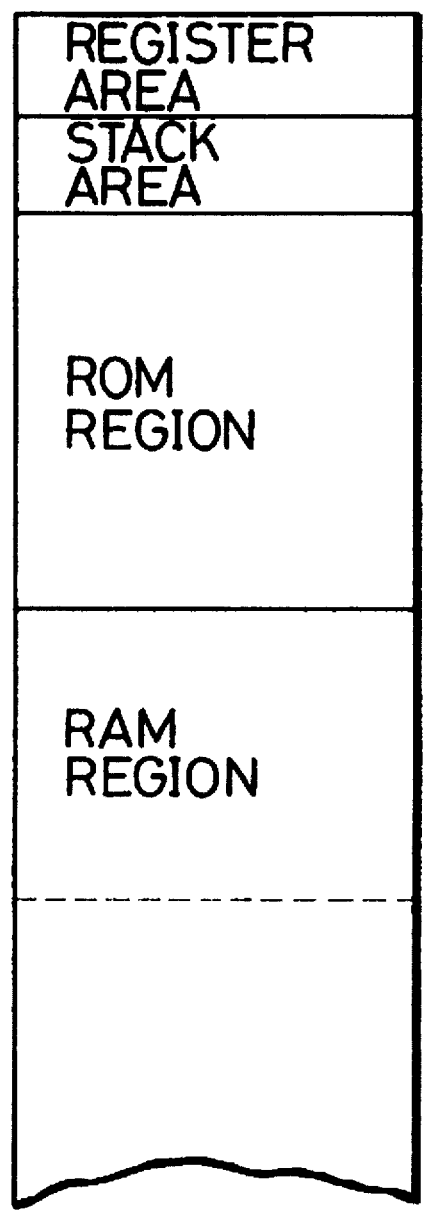
FIG. 4 is a diagram showing a construction of a virtual memory space when a central processing unit performs an operation.

The CPU 1 reads the necessary programs and data from the ROM 30 and the RAM 31 according to the content of the processing and develops them in the internal RAM 35. For example, the CPU 1 performs a specified processing in a virtual memory space shown in FIG. 4, and sends the processing result to the operation panel 4 through the LCD controller 33 and the I/O port 32, or transmits the processing result to the drive controller C2 through the I/F 34 in accordance with a communication mode to be described later.

The CPU 2 includes an internal RAM 40 as well. After executing a specified processing according the method similar to the CPU 1, the CPU 2 outputs the processing result to the image reader Q1 and the imaging assembly Q2 through the I/O port 38, or transmits the same to the operation controller C1 through the I/F 39.

The serial data communication is conducted in accordance with a transmission program, a reception program, and a communication control program including a communication data table. These programs are stored in the ROMs 30, 36. The transmission program consists of a control program including a transmission control, a transmission interrupt control, and the setting of an information to be transmitted during the communication (hereinafter referred to as a communication data). The reception program consists of a control program including a reception interrupt control, a reception error check, and a connection check.

The communication data table consists of a data table for various data transmitted through the serial data communication (hereinafter referred to as a transmission data) and an address data table for an address in a RAM region at the receiving end at which the transmission data is set (hereinafter referred to as a receiving end storage address table).

TABLE-2 below shows an example set of data communicated between the operation and drive controllers C1, C2.

TABLE 2

CONTENTS OF COMMUNICATION DATA

| (A) OPER. CONT. -> DRIVE CONT. | (B) DRIVE CONT. -> OPER. CONT. |
|---|---|
| [NORMAL COMM. DATA] | [NORMAL COMM. DATA] |
| ① COMM. MODE DATA | ① COMM. MODE RECOG. DATA |
| ② CONT. FLAG A | ② STATE FLAG |
| ③ CONT. FLAG B | ③ CASSETTE SIZE DATA |
| ④ COPY MODE FLAG | ④ ENVIRONMENT DATA |
| ⑤ SELECTED CASSETTE INFO. | ⑤ FED SHEET NO. DATA |
| ⑥ MAGNIFICATION DATA | ⑥ DISCHARGED SHEET NO. DATA |
| [SIMULATION DATA] | [HISTORY DATA] |
| ① TONER CONTROL DATA | ① TOTAL DEVELOPMENT NO. DATA |
| ② DEVE. CORRECTION DATA | ② STARTING AGENT REPLACEMENT NO. DATA |
| ③ MAIN CHARGER CONT. DATA | ③ TONER EMPTY NO. DATA |
| ④ MAIN CHARGER CORRE. DATA | ④ UPPER CASSE. FEED NO. DATA |
| ⑤ 1ST FEED TIMING DATA | ⑤ LOWER CASSE. FEED NO. DATA |
| ⑥ 2ND FEED TIMING DATA | ⑥ TOTAL COUNT DATA |
| ⑦ FIXING TEMP. CONT. DATA | ⑦ DEVE. AGING TIME DATA |
| ⑧ LAMP CONT. DATA [OPER. CONT. BACK-UP DATA] | |

TABLE 2-continued

CONTENTS OF COMMUNICATION DATA

| (A) OPER. CONT. -> DRIVE CONT. | (B) DRIVE CONT. -> OPER. CONT. |
|---|---|
| | ① OPER. SIMULATION DATA |
| | ② ABNORM. DETECTION NO. DATA |
| | ③ SET FUNCTION NO. DATA |

In TABLE-2, indicated at (A) are data transmitted from the operation controller C1 to the drive controller C2, and at (B) data transmitted from the drive controller C2 to the operation controller C1.

The normal communication data are used mainly to set a present state of the copying operation and are transmitted between the operation controller C1 and the drive controller C2 constantly while the color digital copying machine 1 operates.

Contents of the respective normal communication data are as follows.

Communication Mode Data: a data representative of a communication mode

Control Flags A, B: various control flag data necessary to control the copying operation, such as a copying operation requirement, a copying operation stop requirement, a counter drive prohibition requirement, a fixing heater turn-on prohibition requirement.

Copy Mode Flag: various flag data concerning a copy mode such as a color or copy, duplex copy, a page continuous copy.

Selected Cassette Information: information on a cassette selected in a manual mode or auto-mode.

Magnification Data: a data concerning a copying magnification in a size enlargement or reduction copying.

Communication Mode Recognition Data: a data used to confirm the communication mode.

State Flag: a flag representative of various states in the drive control block Q such as the fixing temperature, copying operation performed, toner being replenished, absence of copy sheet.

Cassette Size Data: a data representative of the size of copy sheets contained in the set cassette.

Environment Data: a data representative of the environment of the drive control block Q such as the temperature and humidity.

Fed Sheet Number Data: a data representative of the number of copy sheets fed during the copying operation.

Discharged Sheet Number Data: a data representative of the number of copy sheets discharged during the copying operation.

The simulation data are data representing the drive timings and control reference values for various actuators provided in the image reader Q1 and the imaging assembly Q2, and correspond to the drive control data. These data are adjusted and set by simulating the driving of the color digital copying machine 1. The adjusted and set data are stored in the back-up area of the RAM 31 when the simulation is completed, and transmitted from the operation controller C1 to the drive controller C2 to be stored in the data area of the RAM 37.

The history data include various data representing an operation history of the drive control block Q and correspond to the drive block history data. These data are used for a regular inspection and repair of the color digital copying machine 1. The history data are stored in the data area of the RAM 37 in the drive controller C2 and transmitted from the drive controller C2 to the operation controller C1 to be stored in the back-up area of the RAM 31, for example, upon the completion of the copying operation or upon the lapse of a predetermined period.

The operation control back-up data are data which are required for the control of the operation controller C1 and backed up in the drive controller C2. The operation simulation data, corresponding to the operation control data, is set through the simulation. This data is stored in the data area of the RAM 31 and transmitted from the operation controller C1 to the drive controller C2 to be stored in the back-up data area of the RAM 37 upon the completion of the simulation.

The abnormality detection number data is a count data representing the number of detected abnormality occurred in the drive control black Q, and is used to confirm the state and the performance of the color digital copying machine 1. The operation controller C1 counts the number of detected abnormality based on the state flag transmitted from the drive controller C2 and generates the abnormality detection number data. When an abnormality is detected, the operation controller C1 transmits this abnormality detection number data to the drive controller C2.

The set function number data represents the number of various functions set during the copying operation such as a duplex copy and a page continuous copy, and is used to confirm the used state of the color digital copying machine 1. The set function number data is transmitted from the operation controller C1 to the drive controller C2 upon the completion of the copying operation.

The data representing the history such as the history data, the abnormality detection number data and the set function number data may be transmitted by interrupting the communication of the normal communication data. For instance, every time the normal communication data are conducted a specified number of times, the communication mode is switched from the normal communication mode to another communication mode for transmitting the history data and the like, thereby allowing the history data and the like to be interruptingly transmitted. Upon the completion of the communication of these data, the communication mode is switched to the normal communication mode to transmit the normal communication data.

The normal communication data, the simulation data, the history data, and the operation controller back-up data have mutually different communication conditions, such as a communication method (bidirectional communication/ unidirectional communication), the number of data to be transmitted, and the communication time. Accordingly, the communication is conducted in the specified communication mode according to the type of the data. The control program for each communication mode is stored in the ROMs 30, 36.

TABLE-3 below shows the type and contents of the communication mode.

TABLE 3

| MODE NO. | TYPE | CONTENTS |
|---|---|---|
| 0 | NORMAL COMMUNI- CATION | NORMAL COMMUNICATION DATA ARE TRANSMITTED BETWEEN THE OPERATION CONTROLLER |

TABLE 3-continued

| MODE NO. | TYPE | CONTENTS |
|---|---|---|
| | | AND THE DRIVE CONTROLLER |
| 1 | SIMULATION DATA TRANSMISSION MODE A | SIMULATION DATA ARE TRANSMITTED FROM THE OPERATION CONTROLLER TO THE DRIVE CONTROLLER |
| 2 | SIMULATION DATA TRANSMISSION MODE B | SIMULATION DATA ARE TRANSMITTED FROM THE DRIVE CONTROLLER TO THE OPERATION CONTROLLER |
| 3 | HISTORY DATA TRANSMISSION MODE A | HISTORY DATA ARE TRANSMITTED FROM THE OPERATION CONTROLLER TO THE DRIVE CONTROLLER |
| 4 | HISTORY DATA TRANSMISSION MODE B | HISTORY DATA ARE TRANSMITTED FROM THE DRIVE CONTROLLER TO THE OPERATION CONTROLLER |
| 5 | OPERATION SIMULATION DATA TRANSMISSION MODE | OPERATION CONTROLLER SIMULATION DATA ARE TRANSMITTED FROM THE OPERATION CONTROLLER TO THE DRIVE CONTROLLER |
| 6 | ABNORMALITY DETECTION NO. DATA TRANSMISSION MODE | ABNORMALITY DETECTION NO. DATA ARE TRANSMITTED FROM THE OPERATION CONTROLLER TO THE DRIVE CONTROLLER |
| 7 | SET FUNCTION NO. DATA TRANSMISSION MODE | SET FUNCTION NO. DATA ARE TRANSMITTED FROM THE OPERATION CONTROLLER TO THE DRIVE CONTROLLER |
| 8 | OPERATION CONTROL BACK-UP DATA TRANSMISSION MODE | OPERATION CONTROLLER SIMULATION DATA, ABNORMALITY DETECTION NO. DATA, SET FUNCTION NO. DATA ARE TRANSMITTED FROM THE DRIVE CONTROLLER TO THE OPERATION CONTROLLER |

In TABLE-3, the normal communication mode is a communication mode for communicating the normal communication data. When the color digital copying machine 1 is started, the normal communication mode is set as a communication mode and the operation and drive controllers C1, C2 transmit the normal communication data to each other repeatedly unless the data communication in the other communication mode is required.

In the normal communication mode, as shown in TABLE-2, the communication mode data, the control flag data A, the control flag data B, the copy mode flag, the selected cassette information, and the magnification data are transmitted from the operation controller C1 to the drive controller C2. Further, the communication mode recognition data, the state flag, the cassette size data, the environment data, the fed sheet number data and the discharged sheet number data are transmitted from the drive controller C2 to the operation controller C1. These normal communication data are transmitted alternately.

The data are transmitted unidirectionally in the communication modes other than the normal communication mode. In each of these unidirectional communication mode, the number of data to be transmitted, the contents of the data, and the transmitting order of the data are preset in the control program. Accordingly, the transmitting end transmits a fixed number of data unidirectionally to the receiving end in accordance with the specified control program, and the receiving end receives the transmitted data in accordance with the specified control program.

Figures 6A, 6B, 6C:
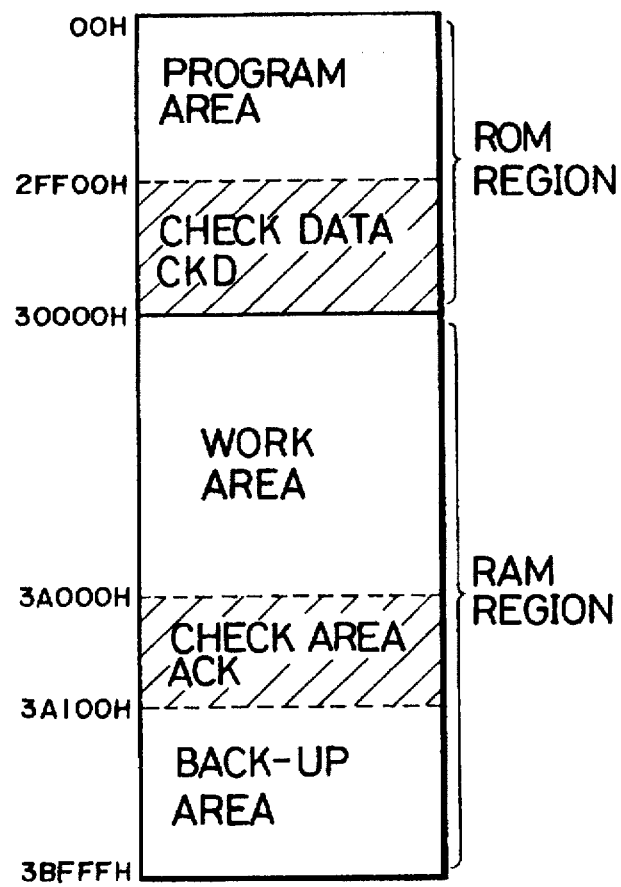
FIGS. 6A, 6B, 6C are diagrams showing a first embodiment according to which a CPU writes check data in the RAM, FIG. 6A showing a storage region for the check data in the virtual memory space, FIG. 6B showing an example of check data stored in a ROM region, and FIG. 6C showing a state in which the above check data are stored in a check area of a RAM region.

FIGS. 6A, 6B, 6C are diagrams showing a first embodiment according to which the CPU 1 writes check data in the RAM, FIG. 6A showing a storage region for the check data in the virtual memory space, FIG. 6B showing an example of check data stored in a ROM region, and FIG. 6C showing a state in which the above check data are stored in a check area of a RAM region.

For example, addresses "00000H" to "2FFFFH" of the virtual memory space are assigned as a ROM region and addresses "30000H" to "3BFFFH" thereof are assigned as a RAM region as shown in FIG. 6A. "H" at the end of the address number indicates that the address number is expressed in hexadecimal number. Hereafter, the data are also expressed in hexadecimal number.

Check data CKD used to check the memory abnormality in the RAM 31 are, for example, prestored in the addresses "2FF00H" to "2FFFFH" of the ROM region (see FIG. 6B). On the other hand, the addresses "3A000H" to "3A0FFH" of the RAM region are assigned as a check area ACK for storing the check data CKD. When the RAM 31 is initialized, the check data CKD are read from the ROM 30 and written in the RAM 31 (see FIG. 6C).

Figure 7:
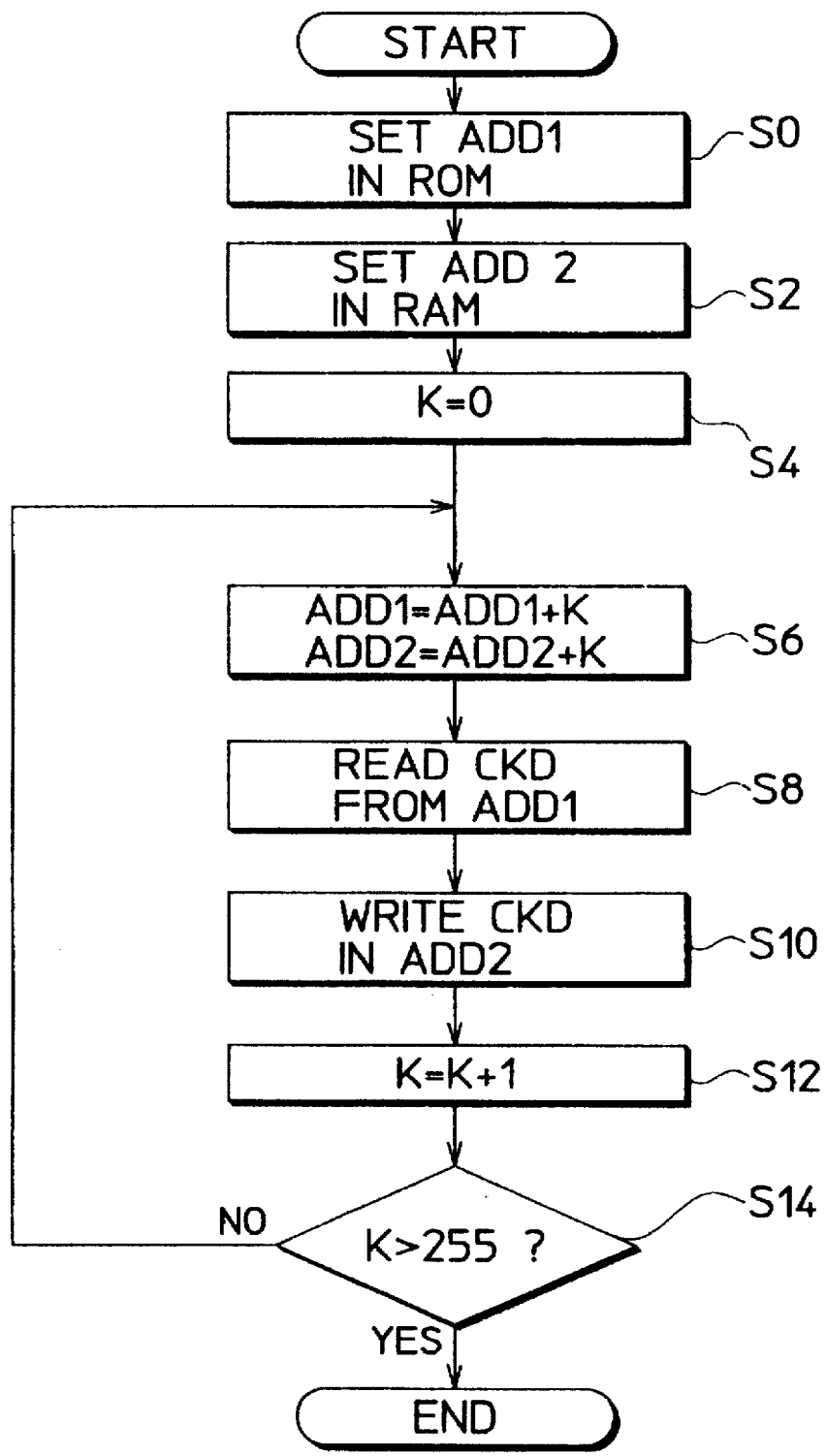
FIG. 7 is a flow chart showing a control executed to write the check data stored in the ROM to the RAM according to the first embodiment.

FIG. 7 is a flow chart showing a control executed to write the check data CKD stored in the ROM 30 in the RAM 31.

Upon proceeding to the control of writing the check data CKD in the RAM 31, the CPU 1 sets a first address ADD1 (=2FF00H) of the storage area of the check data CKD in the ROM 30 and a first address ADD2 (=3A000H) of the check area ACK in the RAM 31, and resets a count value of a counter K to "0" (Steps S0 to S4). The counter K is used to count the 256 check data CKD.

A read-out address of the check data CKD in the ROM 30 and a write-in address thereof in the RAM 31 are set by adding the count value of the counter K respectively to the addresses ADD1, ADD2 (Step S6).

Subsequently, the first check data CKD is read from the read-out address ADD1 of the ROM 30 and written in the write-in address ADD2 of the RAM 31 (Steps S8, S10). The count value of the counter K is incremented by 1 (Step S12), and it is judged whether the count value is greater than 255 (Step S14).

If the count value is not greater than 255, this routine returns to Step S6 and subsequent steps in which the next check data CKD is read from the next read-out address ADD1 of the ROM 30 and written in the next write-in address ADD2 of the RAM 31. The above processing (a loop of Steps S6 to S14) is repeated until the count value of the counter K becomes greater than 255.

More specifically, the check data "42H", "49H", . . . "00H" are successively read from the addresses of the ROM 30 "2FF00H", "2FF01H", . . . , "2FFFFH" and written in the addresses of the RAM 31 "3A000H", "3A001H", . . . , "3A0FFH" (see FIGS. 6B, 6C).

When the count value of the counter K becomes greater than 255 (YES in Step S14), the CPU 1 judges that all the check data CKD have been written in the RAM 31 and finishes the check data CKD writing operation.

Figure 8:
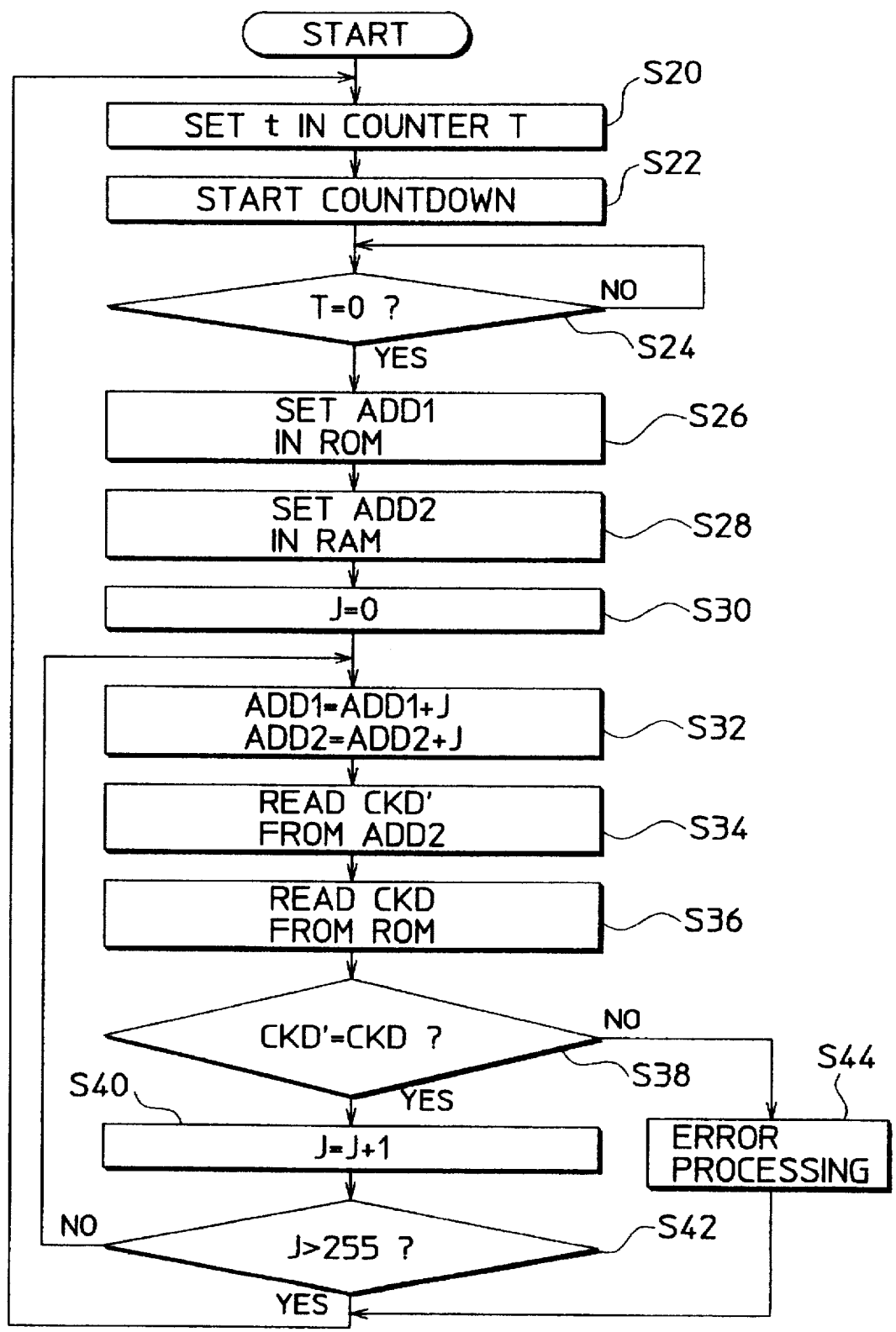
FIG. 8 is a flow chart showing a control executed to check a memory abnormality in the RAM according to the first embodiment.

FIG. 8 is a flow chart showing a control executed to check the memory abnormality in the RAM 31.

The CPU 1 reads the check data CKD' for the RAM 31 regularly while the color digital copying machine 1 is in operation, and checks whether this check data CKD' has been changed. In order to conduct this check regularly, the CPU 1 measures a predetermined time t by setting this time t in a counter T (Steps S20 to S24).

Upon the lapse of the predetermined time t (YES in Step S24), the CPU 1 sets the first address ADD1 (=2FF00H) of the storage area of the check data CKD in the ROM 30 and a first address ADD2 (=3A000H) of the check area ACK in the RAM 31, and resets a count value of a counter J to "0" (Steps S26 to S30).

The counter J is used to count the 256 check data CKD.

A read-out address ADD1 of the check data CKD in the ROM 30 and a read-out address ADD2 of the check data CKD' in the RAM 31 are set by adding the count value of the counter J respectively to the addresses ADD1, ADD2 (Step S32).

Subsequently, the check data CKD' is read from the read-out address ADD2 of the RAM 31 and the check data CKD is read from the read-out address ADD1 of the ROM 30 (Steps S34, S36). It is then judged whether the check data CKD' agrees with the check data CKD (Step S38).

If CKD'=CKD (YES in Step S38), the count value of the counter J is incremented by 1 (Step S40) and it is judged whether this count value is greater than 255 (Step S42). If the count value is not greater than 255, this routine returns to Step S32 and subsequent steps in which the check data CKD, CKD' are read from the next read-out addresses ADD1, ADD2 of the ROM 30 and RAM 31 and it is judged whether the check data CKD' agrees with the check data CKD. So long as the check data CKD' agrees with the check data CKD, the above processing (a loop of Steps S32 to S42) is repeated until the count value of the counter J becomes greater than 255.

More specifically, the check data "42H", "49H", . . . "00H" are successively read from the addresses of the RAM 31 "3A000H", "3A001H", . . . , "3A0FFH" and the check data "42H", "49H", . . . , "00H" are read from the addresses of the ROM 30 "2FF00H", "2FF01H", . . . , "2FFFFH". It is judged successively whether the check data CKD' agree with the corresponding check data CKD.

If all the check data CKD' agree with the corresponding check data CKD and the count value of the counter J becomes greater than 255 (YES in Step S42), it is judged that no abnormality has occurred in the RAM 31 and this routine returns to Step S20.

If at least one check data CKD' is at variance with the corresponding check data CKD (NO in Step S38), it is judged that an abnormality has occurred in the RAM 31 and a specified error processing (Step S44) is executed. This error processing may be, for example, such that the data stored in the RAM 31 are restored by conducting a maintenance of the overall operation controller C1. It will be described later how the data in the RAM 31 are restored.

Figures 9A, 9B, 9C:
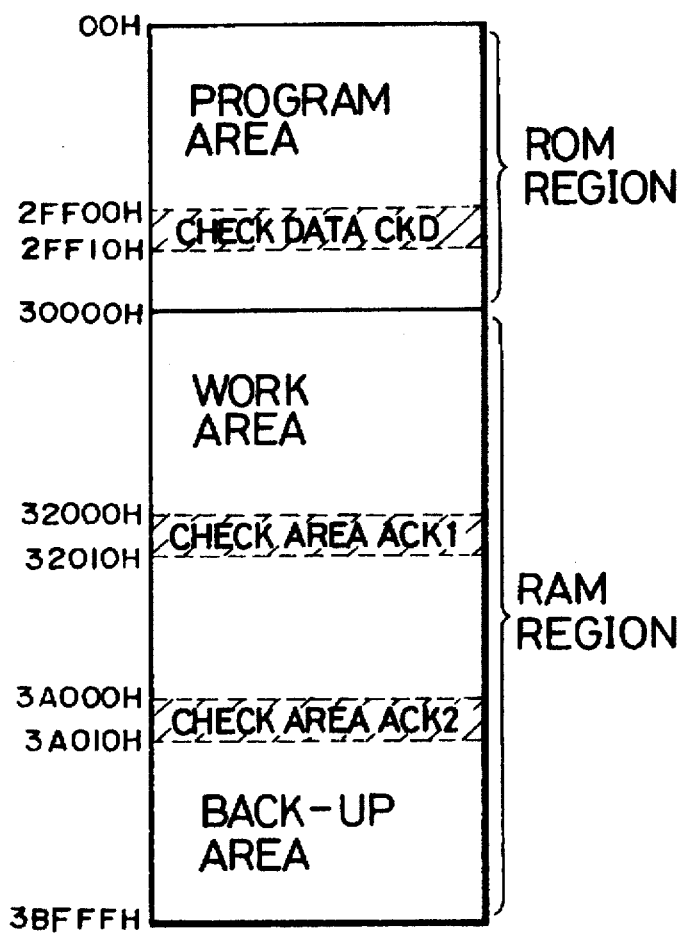
FIGS. 9A, 9B, 9C are diagrams showing a second embodiment according to which a CPU writes check data in the RAM, FIG. 9A showing a storage region for the check data in the virtual memory space, FIG. 9B showing an example of check data stored in a ROM region, and FIG. 9C showing a state in which the above check data are stored in a check area of a RAM region.

FIGS. 9A, 9B, 9C are diagrams showing a second embodiment according to which the CPU 1 writes check data in the RAM, FIG. 9A showing a storage region for the check data in the virtual memory space, FIG. 9B showing an example of check data stored in the ROM region, and FIG. 9C showing a state in which the above check data are stored in the check area of the RAM region.

The second embodiment differs from the first embodiment wherein only one check area ACK is provided in the RAM 31 that check areas ACK1, ACK2 are provided in two different areas of the storage region of the RAM 31 and the check data CKD stored in the ROM 30 are written in these check areas ACK1, ACK2. The second embodiment is designed to conduct an abnormality check in a wider storage region of the RAM 31.

More specifically, as shown in FIG. 9A, addresses of "32000H" to "3200FH" of the RAM region are assigned as a first check area ACK1 and addresses "3A000H" to "3A00FH" thereof are assigned as a second check area ACK2. The check data CKD stored in the addresses "2FF00H" to "2FF0FH" of the ROM region are read and written in the first and second check areas ACK1, ACK2.

Three or more check areas ACK1, ACK2, ACK3, . . . , ACKn may be provided in the different areas of the storage region of the RAM 31. Different check data CKD1, CKD2, . . . , CKDn may be written in these check areas ACK1, ACK2, . . . , ACKn.

Figure 10:
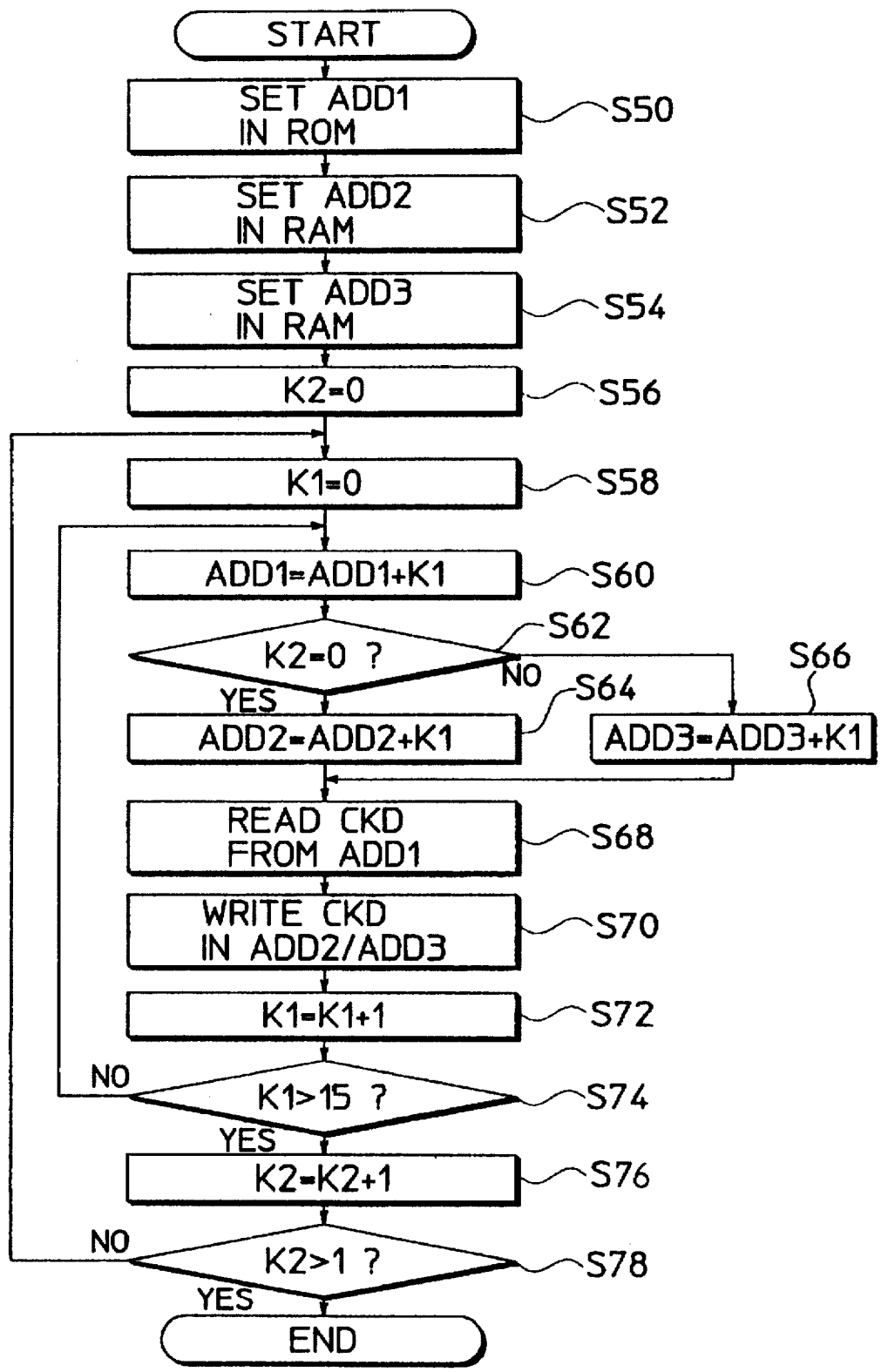
FIG. 10 is a flow chart showing a control executed to write the check data stored in the ROM to the RAM according to the second embodiment.

FIG. 10 is a flow chart showing a control executed to write the check data CKD stored in the ROM 30 in the RAM 31 according to the second embodiment.

The CPU 1 sets a first address ADD1 (=2FF00H) of the storage area of the check data CKD in the ROM 30, a first address ADD2 (=32000H) of the first check area ACK in the RAM 31, and a first address ADD3 (=3A000H) of the second check area ACK2 in the RAM 31, and resets count values of counters K1, K2 to "0" respectively (Steps S50 to S58).

The counter K1 is used to count the 16 check data CKD, and the counter K2 is used to distinguish the first check area ACK1 from the second check area ACK2. The counter K2 reset to "0" is indicative of the processing executed for the first check area ACK1, whereas the counter K2 set to "1" is indicative of the processing executed for the second check area ACK2.

Subsequently, a read-out address for the check data CKD in the ROM 30 is set by adding the count value of the counter K1 to the address ADD1 (Step S60). It is then judged whether the count value of the counter K2 is "0" (Step S62).

If the count value of the counter K2 is "0" (YES in Step S62), a write-in address for this check data CKD in the first check area ACK1 of the RAM 31 is set by adding the count value of the counter K1 to the address ADD2 (Step S64). On the contrary, if the count value of the counter K2 is "1" (NO in Step S60), a write-in address for this check data CKD in the second check area ACK2 of the RAM 31 is set by adding the count value of the counter K1 to the address ADD3 (Step S66).

Since the counter K2 is reset to "0" in the first run, this routine proceeds directly from Step S62 to Step S64 in which the write-in address ADD2 for the check data CKD in the first check area ACK1 of the RAM 31 is set.

Subsequently, the check data CKD is read from the read-out address ADD1 of the BOH 30 (Step S68) and written in the write-in address ADD2 of the RAM 31 (Step S70). The count value of the counter K1 is incremented by 1 (Step S72), then it is judged whether the count value of the counter K1 is greater than 15 (Step S74).

If the count value of the counter KI is not greater than 15 (NO in Step S74), this routine returns to Step S60 and subsequent steps in which the next check data CKD is read from the next read-out address ADD1 of the ROH 30 and written in the next write-in address ADD2 of the RAM 31. The above processing (a loop of Steps S60 to S72) is repeated until the count value of the counter K1 becomes greater than 15.

More specifically, the check data "3CH", "53H", . . . , "3EH" are successively read from the addresses of the ROM 30 "2FF00H", "2FF01H", . . . , "2FF0FH" and written in the addresses of the RAM 31 "32000H", "32001H", . . . , "3200FH" (see FIGS. 9B, 9C).

When the count value of the counter K1 becomes greater than 15 (YES in Step S74), the count value of the counter K1 is incremented by 1 (Step S76). It is then judged whether the count value of the counter K1 is greater than 1 (Step S78).

If the count value of the counter K2 is not greater than 1 (NO in Step S78), this routine returns to Step S58 and subsequent steps (a loop of Steps S60, S62, S66 to S74) in which the check data CKD are successively read from the respective read-out addresses ADD1 of the ROM 30 (Step S68) and written in the respective write-in addresses ADD3 in the second check area ACK2 of the RAM 31.

More specifically, the check data "3CH", "53H", . . . , "3EH" are successively read from the addresses of the ROM 30 "2FF00H", "2FF01H", . . . , "2FF0FH" and written in the addresses of the RAM 31 "3A000H", "3A001H", . . . , "3A00FH" (see FIGS. 9B, 9C).

When the count value of the counter K1 becomes greater than 15 and the check data CKD have been completely written in the second check area ACK2 of the RAM 31 (YES in Step S74), the count value of the counter K2 is incremented to 2 (Step S76). When count value of the counter K2 becomes greater than 1 (YES in Step S78), it is judged that the writing of the check data CKD have been completed, thereby finishing the writing operation.

Figure 11:
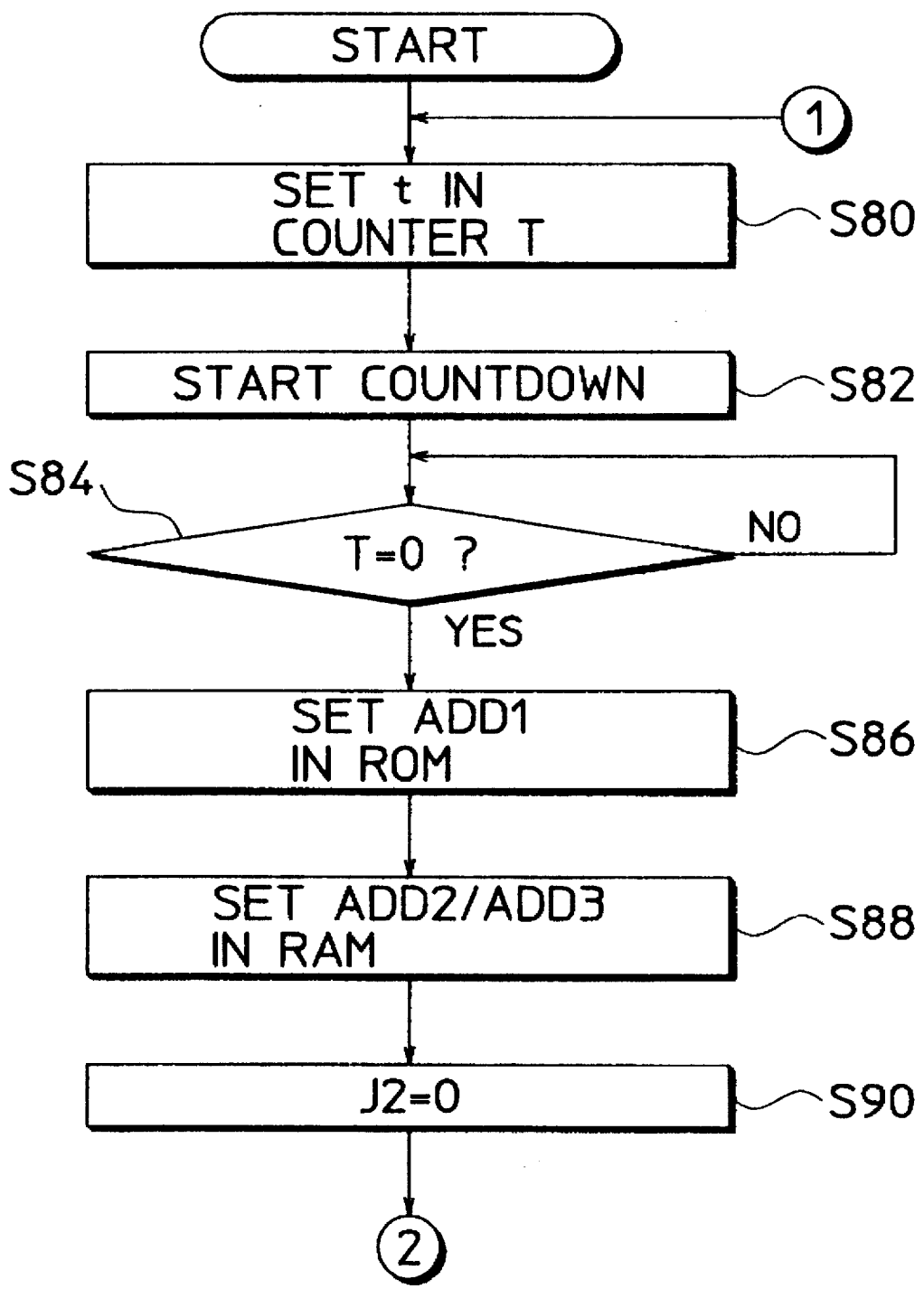
FIGS. 11, 12 are flow charts showing a control executed to check a memory abnormality in the RAM according to the second embodiment.
Figure 12:
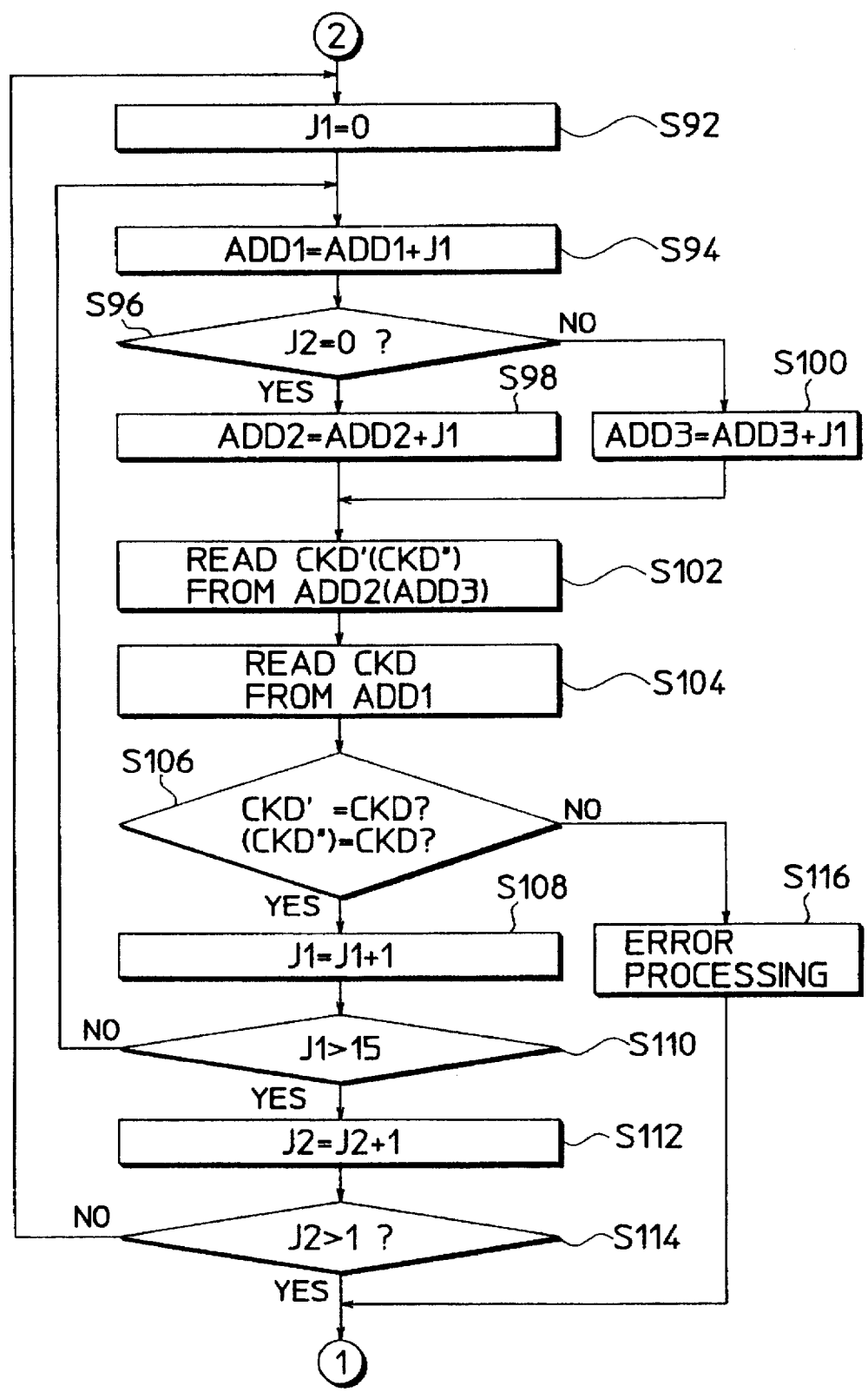

FIGS. 11, 12 are flow charts showing a control executed to check a memory abnormality in the RAM 31 according to the second embodiment.

Similar to the first embodiment, the CPU 1 reads the check data CKD for the RAM 31 regularly while the color digital copying machine 1 is in operation, and checks whether this check data CKD has been changed.

Upon the lapse of a predetermined time t (Steps S80 to S84, YES in Step S84), the CPU 1 sets the first address ADD1 (=2FF00H) of the storage area of the check data CKD in the ROM 30 and the first addresses ADD2 (=3A000H), ADD3 (=3A000H) in first and second check areas ACK1, ACK2 of the RAM 31 (Steps S86, S88), and resets count values of counters J1, J2 to "0" (Steps S90, S92).

The counter J1 is used to count the 16 check data and the counter J2 is used to distinguish the first check area ACK1 from the second check area ACK2. The counter J2 reset to "0" is indicative of the processing executed for the first check area ACK1, whereas the counter J2 set to "1" is indicative of the processing executed for the second check area ACK2.

Subsequently, the read-out address for the check data CKD in the ROM 30 is set by adding the count value of the counter J1 to the address ADD1 (Step S94). It is then judged whether the count value of the counter J2 is "0" (Step S96).

If the count value of the counter J2 is "0" (YES in Step S96), a read-out address for a check data CKD' in the first check area ACK1 of the RAM 31 is set by adding the count value of the counter J1 to the address ADD2 (Step S98). On the contrary, if the count value of the counter J2 is "1" (NO in Step S96), a read-out address for a check data CKD" in the second check area ACK2 of the RAM 31 is set by adding the count value of the counter J1 to the address ADD3 (Step S100).

Since the counter J2 is reset to "0" in the first run this routine proceeds directly from Step S96 to Step S98 in which the read-out address ADD2 for the check data CKD' in the first check area ACK1 of the RAM 31 is set.

Subsequently, the check data CKD' is read from the address ADD2 of the RAM 31 and the check data CKD is read from the address ADD1 of the ROM 30 (Steps S102, S104). In Step S106, it is judged whether the read check data CKD, CKD' agree with each other.

If CKD'=CKD (YES in Step S106), the count value of the counter J1 is incremented by 1 (Step S108), then it is judged whether the count value of the counter J1 is greater than 15 (Step S110). If this count value is not greater than 15 (NO in Step S110), this routine returns to Step S94 and subsequent steps in which the check data CKD, CKD' are read from the next read-out addresses ADD1, ADD2 of the ROM 30 and RAM 31 and it is judged whether these read check data CKD, CKD' agree. The above processing (a loop of Steps S94 to S110) is repeated until the count value of the counter J1 becomes greater than 15, so long as the check data CKD, CKD' from the addresses ADD1, ADD2 agree. More specifically, the check data "3CH", "53H", . . . , "3EH" are successively read from the addresses of the RAM 31 "32000H", "32001H", . . . , "3200FH" and from the addresses of the ROM 30 "2FF00H", "2FF01H", . . . , "2FF0FH". It is successively judged whether the check data CKD' agree with the corresponding check data CKD.

On the other hand, if CKD'≠CKD (NO in Step S106), i.e., if at least one of the check data CKD' is at variance with its corresponding check data CKD, it is judged that an abnormality has occurred in the RAM 31 and the aforementioned error processing is executed (Step S116).

When no memory abnormality is found in the check data CKD' in the first check area ACK1 and the count value of the counter J1 becomes greater than 15 (YES in Step S110), the count value of the counter J2 is incremented by 1 (Step S112). It is then judged whether the count value of the counter J2 is greater than 1 (Step S114).

If the count value of the counter J2 is not greater than 1 (NO in Step S114), this routine returns to Step S92 and subsequent steps in which the check data CKD, CKD' are read from the read-out addresses ADD1, ADD3 of the ROM 30 and RAM 31 and it is judged whether these read check data CKD, CKD' agree. The above processing (a loop of Steps S94, S96, S100 to S110) is repeated until the count value of the counter J1 becomes greater than 15, so long as the check data CKD, CKD" from the addresses ADD1, ADD3 agree.

More specifically, the check data "3CH", "53H", . . . , "3EH" are successively read from the addresses of the RAM 31 "3A000H", "3A001H", . . . , "3A00FH" and from the addresses of the ROM 30 "2FF00H", "2FF01H", . . . , "2FF0FH" It is successively judged whether the check data CKD" agree with the corresponding check data CKD.

On the other hand, if CKD"≠CKD (NO in Step S106), i.e., if at least one of the check data CKD" is at variance with its corresponding check data CKD, it is judged that an abnormality has occurred in the RAM 31 and the aforementioned error processing is executed (Step S116).

When no memory abnormality is found in the check data CKD" in the second check area ACK2 and the count value of the counter J1 becomes greater than 15 (YES in Step S110), thereby completing the memory check for the second check area ACK2 of the RAM 31, the count value of the counter J2 is incremented by 1 to 2 (Step S112). It is then judged that the memory check has been completed since the count value of the counter J2 is greater than 2 (YES in Step S114) and this checking control is completed.

Figures 13A, 13B:
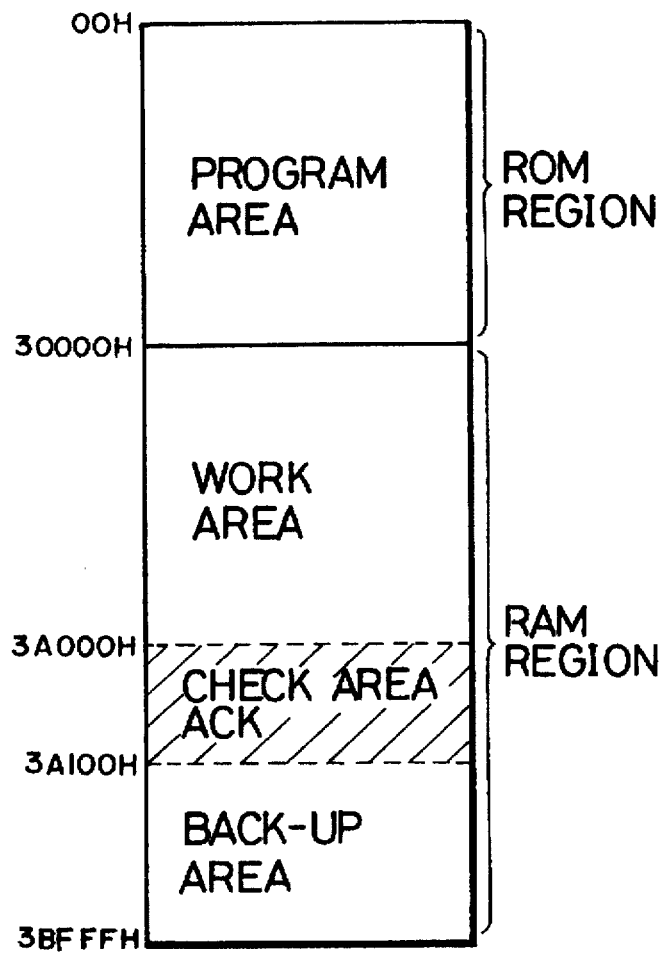

FIGS. 13A, 13B, 13C are diagrams showing a third embodiment according to which the CPU 1 writes check data in the RAM, FIG. 13A showing a storage region for the check data in the virtual memory space, FIG. 13B showing an example of check data stored in a ROM region, and FIG. 13C showing a state in which the above check data are stored in a check area of a RAM region.

In the foregoing first and second embodiments, the check data CKD prestored in the ROM 30 are written in the check area ACE of the RAM 31. However, in the third embodiment, check data CKD are calculated in accordance with a specified operation expression and written in the check area ACK of the RAM 31.

More specifically, as shown in FIG. 13B, a sequence of numbers "00H", "01H", "02H", ..., "FFH" are written as check data CKD in addresses of a RAM region assigned as a check area ACK, namely, "3A000H" to "3A0FFH" one after another from the address "3A000H". The third embodiment eliminates the need to store the check data CKD in the ROM 30, thereby enabling the more efficient use of the ROM 30.

Figure 14:
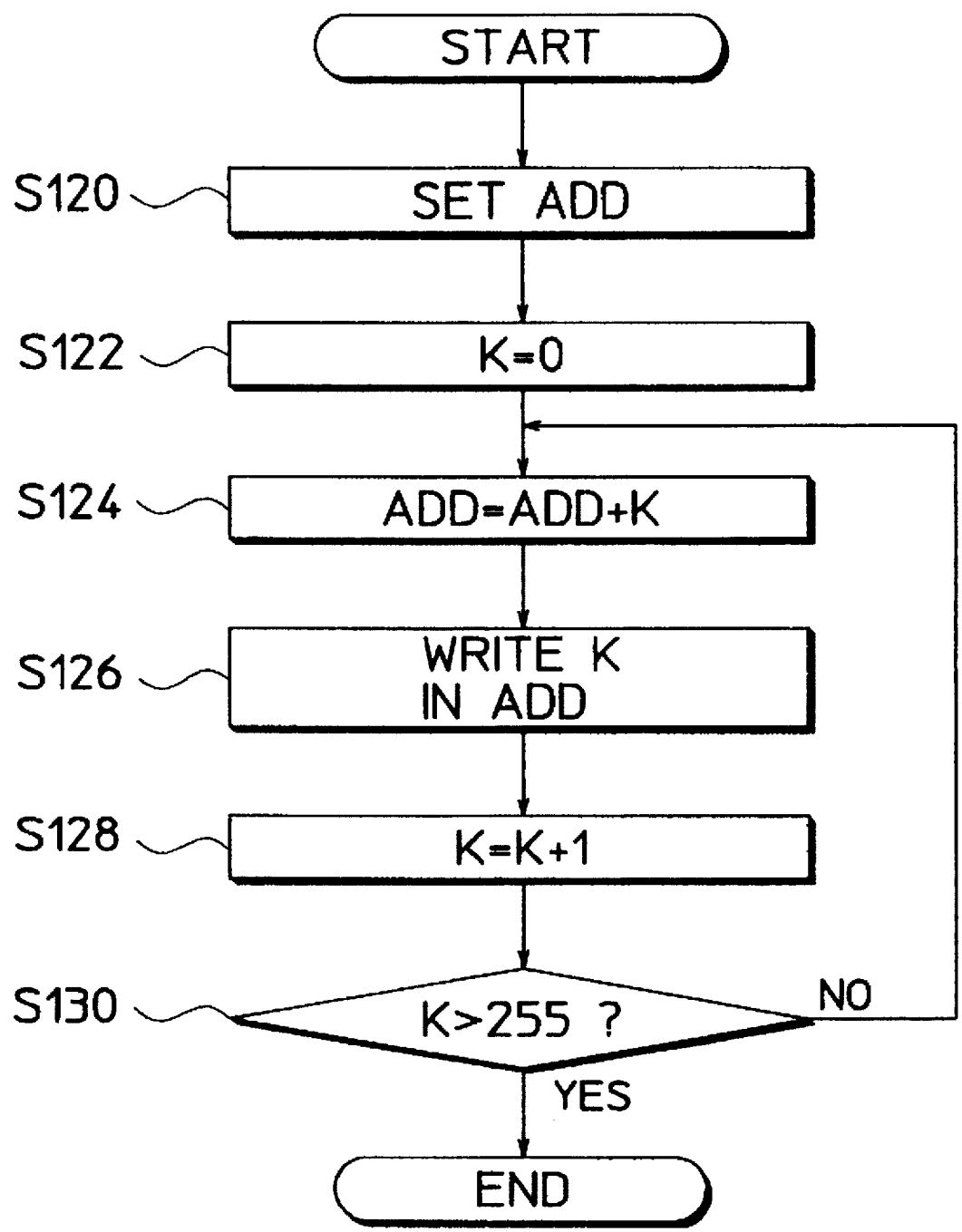
FIG. 14 is a flow chart showing a control executed to write the check data stored in the ROM to the RAM according to the third embodiment.

FIG. 14 is a flow chart showing a control executed to write the calculated check data CKD in the RAM 31 according to the third embodiment.

Upon proceeding to the control of writing the check data CKD in the check area ACK of the RAM 31, the CPU 1 sets a first address ADD (=3A000H) of the check area ACK and a count value of a counter K is reset to "0" (Steps S120, S122). The CPU 1 then sets a write-in address for the check data CKD in the RAM 31 by adding the count value of the counter K to the address ADD, and writes the count value of the counter K in the write-in address ADD as a check data CKD (Step S124, S126).

The count value of the counter E is incremented by 1 (Step S128), then it is judged whether this count value is greater than 255 (Step S130). If the count value is not greater than 255 (NO in Step S130), this routine returns to Step S124 and subsequent steps in which the incremented count value of the counter K is written in the next write-in address ADD of the RAM 31 as a check data CKD. The above processing is repeated until the count value of the counter K becomes greater than 255 (a loop of Steps S124 to S130).

More specifically, the check data CKD "00H", "01H", ..., "FFH" are successively written in the addresses of the RAM 31, namely "3A000H", "3A001H", ..., "3A0FFH" (see FIG. 13B).

When the count value of the counter K becomes greater than 255 (YES in Step S130), it is judged that all the check data CKD has been completely written and the check data writing operation is completed.

Figure 15:
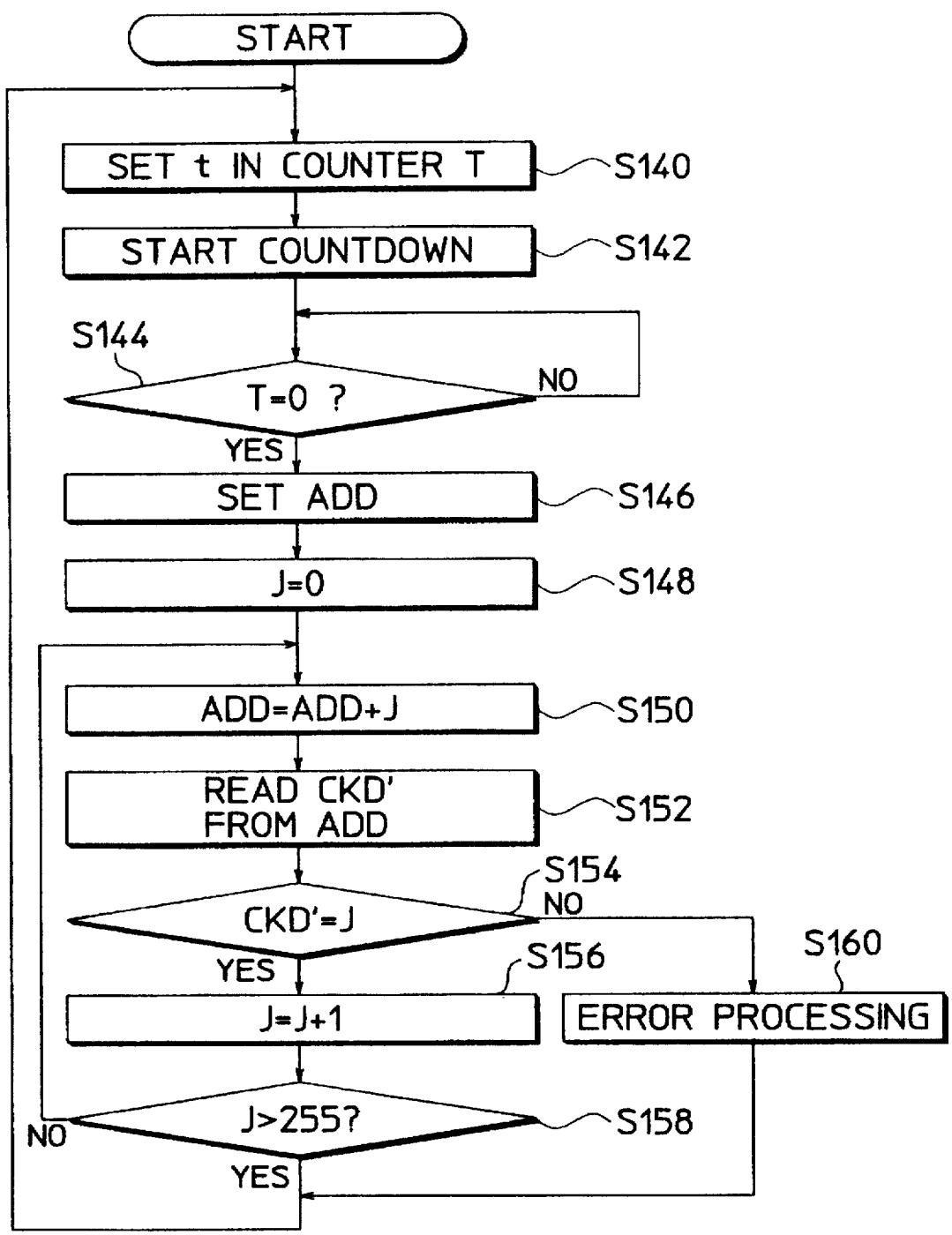
FIG. 15 is a flow chart showing a control executed to check a memory abnormality in the RAM according to the third embodiment.

FIG. 15 is a flow chart showing a control executed to check a memory abnormality in the RAM 31 according to the third embodiment.

The CPU 1 reads the check data CKD for the RAM 31 regularly while the color digital copying machine is in operation, and checks whether this check data CKD has been changed.

More specifically, upon the lapse of a predetermined time t (Steps S140 to S144, YES in Step S144), the CPU 1 sets the first address ADD (=3A000H) in the check area ACK of the RAM 31 and resets a count value of the counter J to "0" (Steps S146, S148).

Subsequently, a read-out address ADD for the check data CKD in the RAM 31 is set by adding the count value of the counter J to the address ADD. The check data CKD' is read from this read-out address and it is judged whether the check data CKD' agrees with the count value of the counter J (Steps S150 to S154).

If the check data CKD' agrees with the count value of the counter J (YES in Step S154), the count value of the counter J is incremented by 1 (Step S156). It is then judged whether this count value is greater than 255 (Step S158). If the count value of the counter J is not greater than 255 (NO in Step S158), this routine returns to Step S150 and subsequent steps in which the next check data CKD' is read from the next read-out address ADD of the RAM 31 and it is judged whether the read check data CKD' agrees with the incremented count value. The above processing is repeated until the count value of the counter J becomes greater than 255, so long as each check data CKD' read from the read-out address agrees with the corresponding incremented count value of the counter J (a loop of Steps S150 to S158).

More specifically, the check data CKD "00H""01H", ..., "FFH" are successively written in the addresses of the RAM 31, namely "3A000H""3A001H" ... "3A0FFH" and it is judged whether the respective check data CKD' agree with the check data "00H", "01H", ..., "FFH" consisting of the count values of the counter J.

If all the check data CKD' agree with the corresponding count values of the counter J and the count value of the counter J becomes greater than 255 (YES in Step S158), it is judged that no memory abnormality has been occurred in the RAM 31 and this routine returns to Step S140.

On the other hand, if the check data CKD' is at variance with the corresponding count value of the counter J (NO in Step S154), i.e., if there is found at least one disagreeing check data CKD', it is judged that a memory abnormality has occurred in the RAM 31 and the aforementioned error processing (Step S160) is executed.

Although the check data CKD consist of an arithmetic progression having a common difference of 1 in the third embodiment, any check data CKD will do provided that they are calculated in accordance with a specified operation expression based on the respective addresses of the check area ACK. For example, the check data CKD may consist of an arithmetic progression having a desired common difference or a geometric progression having a desired common ratio. Alternately, a logical operation result such as a logical OR or exclusive OR of a current address A(j) and a next address A(j+1) may be used as the check data CKD stored in the current address (j).

Although the memory check for the RAM 31 is conducted upon each lapse of the predetermined time t in the first to third embodiments, this memory check may be conducted every time the RAM 31 is accessed a specified number of times. Alternately, the memory check may be conducted when a specified operation is performed, such as when the main motor is driven or the copying operation is performed a specified number of times. The memory check may be also conducted when an abnormal variation of a supply voltage is detected in the operation or drive controller C1, C2, or an abnormal overcurrent resulting from the electrostatics or the like is detected.

In the foregoing embodiments, the memory check is described with respect to the RAM 31 of the operation controller C1. The check data is written in the RAM 37 of the drive controller C2 and the memory check is conducted for the RAM 37 in a similar manner.

There will be next described how the data are restored when the memory abnormality occurs in the RAMs 31, 37.

The data stored in the RAM 31 are restored by reading specified data and back-up data from the ROM 30 and the RAM 37 of the drive controller C2 and writing the read data in a specified storage area of the RAM 31. The data stored in the RAM 37 are restored by reading specified data and back-up data from the ROM 36 and the RAM 31 of the operation controller C1 and writing the read data in a specified storage area of the RAM 37.

The back-up data are reset during the above data restoration by conducting an initialization simulation and a data communication. The color digital copying machine 1 as an embodiment of the invention is capable of conducting the following four types of initialization simulations.

(1) Simulation Code "701"

This is an initialization simulation carried out to restore the data stored in the RAMs 31, 37. During the initialization simulation "701," the operation control data, the IPU control data, the operation RAM check data, and the reader history data are initialized in the operation controller C1, and the drive control data, the drive RAM check data, and the drive history data are initialized in the drive controller C2.

In the ROM 30 are prestored default values for the operation RAM check data, the operation control data, and the IPU control data. When the back-up data in the RAM 31 are reset, the operation RAM check data, the default values for the operation control data, and the IPU control data read from the ROM 30 are written in a specified back-up area of the RAM 31.

The default value is an initial control data and is, for example, a central value in the designing or an average value calculated empirically. In the individual color digital copying machines 1, the actual control data are adjusted and set by carrying out a simulation based on the default value.

Since the reader history data is not backed up by the operation controller C1, a desired data, e.g., "0" is written in the specified back-up area of the RAM 31 as an initial value.

In the ROM 36 are prestored default values for the drive RAM check data and the drive control data. When the back-up data in the RAM 31 are reset, the default values for the drive RAM control data and the drive control data read from the ROM 36 are written in a specified back-up area of the RAM 37. Since the drive block history data is not backed up by the drive controller C2, a desired data. e.g., "0" is written in the specified back-up area of the RAM 37 as an initial value.

The initialization simulation "701" is carried out when the back-up data are written in the RAMs 31, 37 at the time of the manufacturing and when the memory abnormality occurs in both of the RAMs 31, 37.

(2) Simulation Code "702"

This is an initialization simulation carried out to restore the data in the RAM 37. During the initialization simulation "702" various data are initialized in the drive controller C2. These data include the drive control data, the drive RAM check data, the drive block history data, and back-up data for the operation control data, the IPU control data and the reader history data.

(3) Simulation Code "703"

This is an initialization simulation carried out to restore the data in the RAM 31. During the initialization simulation "703" various data are initialized in the operation controller C1. These data include the operation control data, the IPU control data, the reader history data, and back-up data for the drive RAM check data and the drive block history data.

(4) Simulation Code "704"

This is an initialization simulation carried out to restore the reader history data in the RAM 31 and the drive block history data in the RAM 37.

The initialization simulations by the simulation codes "701" to "704" are carried out by transmitting the back-up data between the operation controller C1 and the drive controller C2. The data communication during the initialization simulation is controlled by the operation controller C1 and is conducted according to a handshaking method.

Normally, a service person carries out the resetting of the data in the RAMs 31, 37 through the initialization simulation and the data communication. More specifically, when the memory abnormality is detected by the aforementioned memory check for the RAMs 31, 37, the operation of the color digital copying machine 1 is stopped and a message warning an occurrence of abnormality or calling for an inspection by a service person is displayed in the LCD unit 402 of the operation panel 4. Upon being called because of this message, the service person causes the content of the abnormality to be displayed in the LCD unit 402 to confirm the memory abnormality in the RAM 31 (or the RAM 37). After conducting repair and inspection by, for example, replacing a substrate on which the RAM 31 (or RAM 37) is placed, the necessary initialization simulation and data communication are carried out to restore the data in the RAM 31 (or RAM 37).

When the memory abnormality occurs in the RAMs 31, 37, it is preferable that the abnormality is judged to be a data distortion and the color digital copying machine 1 restores the data in the RAMs 31, 37 automatically. When, for example, the automatic data restoring operation is carried out more than a predetermined number of times or it is carried out continuously a specified number of times within a fixed period of time, it is judged that the RAMs 31, 37 themselves are in an abnormal state and the service person is called to conduct the necessary repair and inspection.

More specifically, when the memory abnormality is detected by the aforementioned memory check for the RAM 31 (or RAM 37), the specified initialization simulation and data communication are carried out to restore the data in this RAM 31 (or RAM 37) by initializing the check data, various control data, and history data in the RAM 31 (or RAM 37). When the data restoring operation is carried out more than the predetermined number of times, the CPU 1 judges that the RAM 31 (or RAM 37) itself is in the abnormal state and causes the LCD unit 402 of the operation panel 4 to display a message warning an occurrence of abnormality or calling for an inspection by a service person.

This arrangement allows the color digital copying machine 1 to be brought into a normal state easily and promptly when the memory abnormality results only in the date distortion, and avoids as much as possible the inconvenience that the color digital copying machine 1 cannot be used until the maintenance or inspection by the service person is completed.

Figure 16:
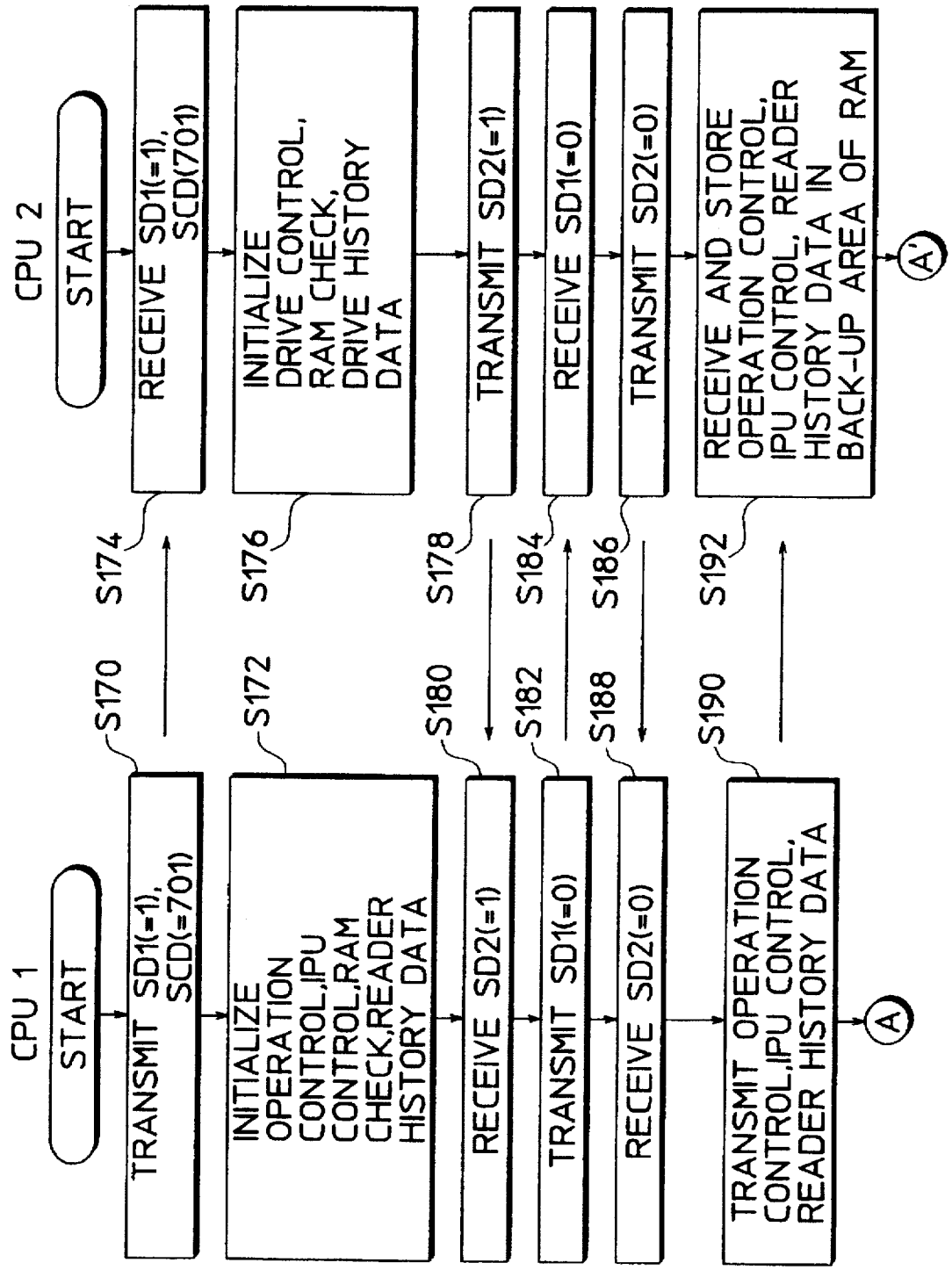
FIGS. 16, 17 are flow charts showing an initialization simulation control using a simulation code "701"
Figure 17:
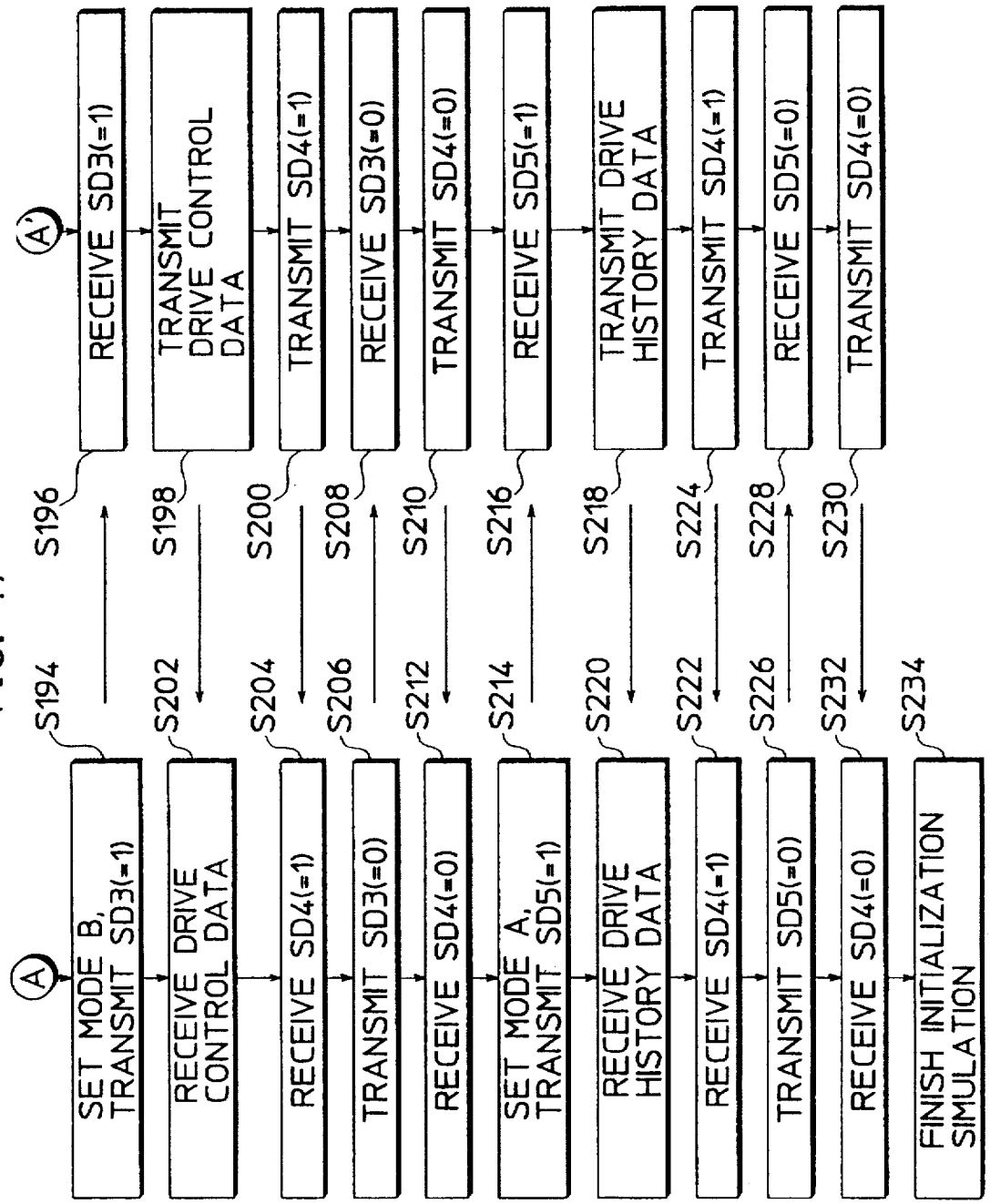

FIGS. 16, 17 are flow charts showing a control executed to carry out the initialization simulation by the simulation code "701".

When the initialization simulation by the simulation code "701" is started, the CPU 1 transmits to the CPU 2 a simulation execution data SD1 and a simulation code data SCD (=701) representing the type of the simulation code (Step S170). The simulation execution data SDI is a flag data, and indicates the execution of the simulation when set to, for example, "1".

The CPU 1 then initializes the operation control data, the IPU control data the operation RAM check data, and the reader history data in the RAM 31 (Step S172).

More specifically, the CPU 1 reads the default values for the operation control data and the IPU control data, and the operation RAM check data from the ROM 30. The CPU 1 writes the read data in the specified storage area of the RAM 31.

The operation RAM check data are initialized by writing controllably the check data CKD in the specified check area ACK of the RAM 31. When the check data CKD is set through the calculation, the calculation result is written in the specified check area ACK.

The reader history data are initialized by writing a desired data. i.e., "0" in the RAM 31 as an initial value, since the back-up data for the reader history data are not stored in the operation controller C1.

On the other hand, upon the receipt of the simulation execution data SD1 and the simulation code data SCD, the CPU 2 recognizes the start of the initialization simulation by the simulation code "701" (Step S174) and initializes the drive control data, the drive RAM check data, and the drive block history data in the RAM 37 (Step S176).

More specifically, the CPU 2 reads the default values for the drive control data from the ROM 36 and writes the same in a specified storage area of the RAM 37. The CPU 2 also writes the check data CKD read from the ROM 36 or calculated using an operation expression in the specified check area ACK of the RAM 37. Further, the CPU 2 writes a desired data. e.g., "0" in the RAM 37 as an initial value of the drive block history data.

Upon the completion of the initialization, the CPU 2 transmits an initialization completion data SD2 to the CPU 1 (Step S178). The simulation completion data SD2 is a flag data, and indicates the completion of the simulation when set to, for example, "1".

Upon the receipt of the initialization completion data SD2, the CPU i recognizes that the RAM 37 has been initialized (Step S180), and transmits the simulation execution data SD1 to the CPU 2 after resetting it to "0" (Step S182). Upon the receipt of the simulation execution data reset to "0", the CPU 2 recognizes that the execution of the simulation tion has been completed (Step S184), and transmits the initialization completion data SD2 to the CPU 1 after resetting it to "0" (Step S186).

Upon the receipt of the initialization completion data SD2 reset to "0", the CPU 1 recognizes that the initialization simulation has been completed (Step S188), and sets the communication mode to the operation controller simulation data transmission mode (see TABLE-3). The CPU 1 then reads the operation control data, the IPU control data, and the reader history data from the RAM 31 and transmits these data to the CPU 2 as back-up data (Step S190). Upon the receipt of these data, the CPU 2 stores them in the specified back-up area of the RAM 37 (Step S192).

The CPU 1 sets the communication mode to the simulation data transmission mode B (see TABLE-3) and transmits a simulation data transmission requirement data SD3 to the CPU 2 (Step S194). The simulation data transmission requirement data SD3 is a flag data. For example, the data SD3 indicates the transmission requirement when set to "1", while indicating the cancellation of the transmission requirement when set to "0".

Upon the receipt of the simulation data transmission requirement data SD3 (Step S196), the CPU 2 reads the drive control data from the RAM 37 and transmits the same as back-up data to the CPU 1 (Step S198). Upon the completion of the transmission of the drive control data, the CPU 2 transmits to the CPU 1 a mode communication completion data SD4 representing the completion of the data transmission (Step S200). The mode communication completion data SD4 is a flag data and indicates the completion of the data transmission when, for example, set to "1".

Upon the receipt of the drive control data, the CPU 1 stores them in the specified back-up area of the RAM 31 (Step S202). Upon the receipt of the mode communication completion data SD4, the CPU 1 recognizes that the back-up data have been completely transmitted (Step S204), and transmits the simulation data transmission requirement data SD3 to the CPU 2 after resetting it to "0" (Step S206).

Upon the receipt of the simulation data transmission requirement data SD3 reset to "0", the CPU 2 recognizes the completion of the data communication in the simulation data transmission mode B (Step S208). The CPU 2 then transmits the mode communication completion data SD4 to the CPU 1 after resetting it to "0" (Step S210).

Upon the receipt of the mode communication completion data SD4 reset to "0" the CPU 1. recognizes that the CPU 2 is in a data communication enabled state (Step S212) and transmits a history data transmission requirement data SD5 (Step S214). The history data transmission requirement data SD5 is also a flag data. For example, the data SD5 indicates the transmission requirement when set to "1", while indicating the cancellation of the transmission requirement when set to "0".

Upon the receipt of the history data transmission requirement data SD5 (Step S216), the CPU 2 reads the drive block history data from the RAM 37 and transmits them as the back-up data to the CPU 1 (Step S218).

Hereafter, similar to the communication for the drive control data in the simulation data transmission mode B, the mode communication completion data SD4 and the history data transmission requirement data SD5 are transmitted to confirm a control state of the other end (Steps S220 to S232). Upon the receipt of the mode communication completion data SD4 reset to "0", the CPU 1 judges that the communication for the necessary back-up data has been completed (Step S232) and finishes the control for the initialization simulation by the simulation code "701" (Step S234).

Figure 18:
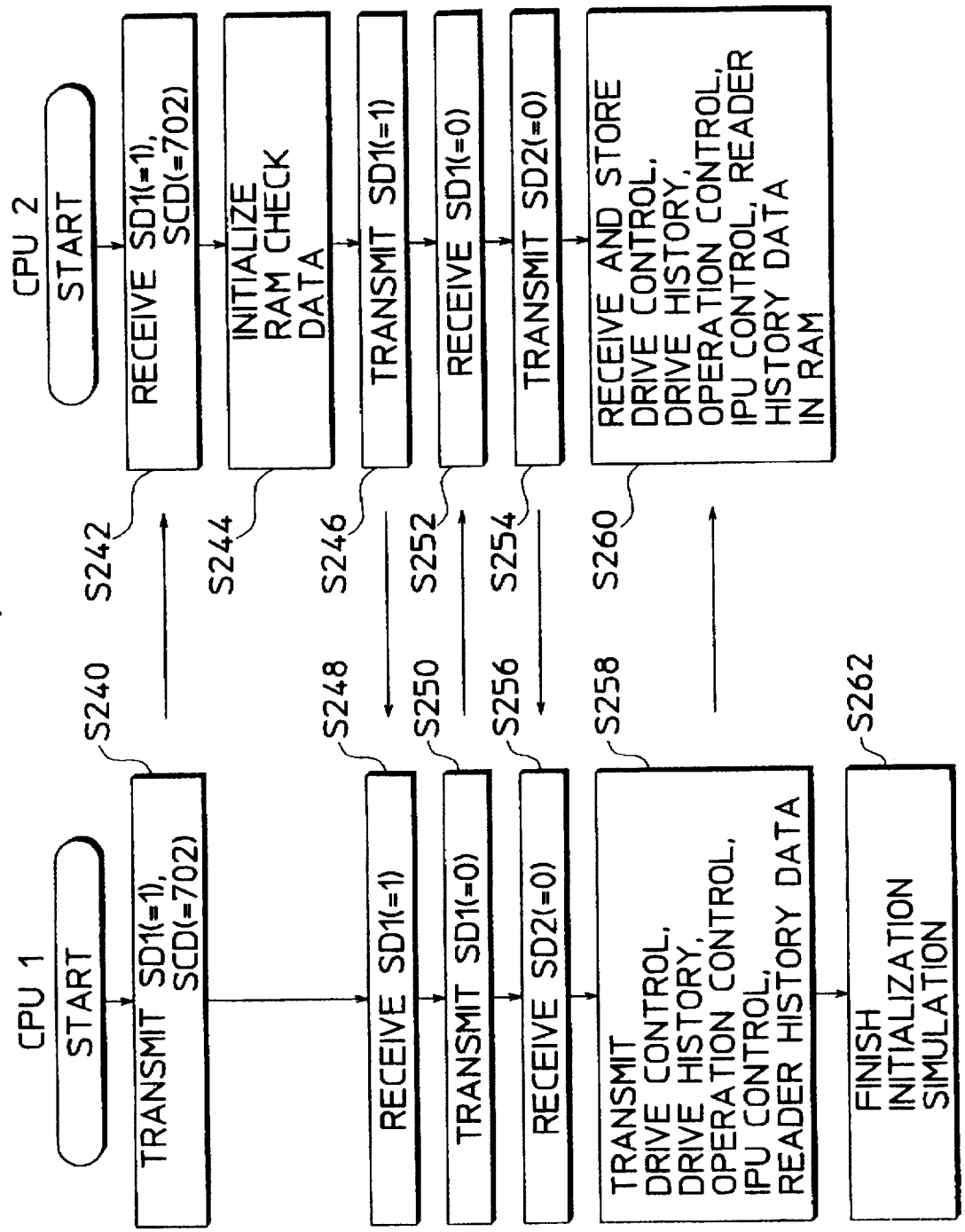
FIG. 18 is a flow chart showing an initialization simulation control using a simulation code "702"

FIG. 18 is a flow chart showing a control executed to carry out the initialization simulation by the simulation code "702".

When the initialization simulation by the simulation code "702" is started, the CPU 1 transmits to the CPU 2 the simulation execution data SD1 and the simulation code data SCD (=702) representing the type of the simulation code (Step S240).

Upon the receipt of the simulation execution data SD1 and the simulation code data SCD, the CPU 2 recognizes the start of the execution of the initialization simulation by the simulation code "702" (Step S242). The CPU 2 then initializes the drive BAH check data by writing the check data CKD read from the ROM 36 or calculated using a specified operation expression in the specified check area ACK of the RAM 37 (Step S244). Upon the completion of this initialization, the CPU 2 transmits the initialization completion data SD2 to the CPU 1 (Step S246).

Upon the receipt of the initialization completion data SD2, the CPU 1 recognizes the completion of the initialization for the drive RAM check data (Step S248). The CPU 2 then transmits the simulation execution data SD1 to the CPU 2 after resetting it to "0" (Step S250).

Upon the receipt of the simulation execution data SD1 reset to "0", the CPU 2 recognizes the completion of the execution of the simulation (Step S252). The CPU 2 then transmits the initialization completion data SD2 to the CPU 1 after resetting it to "0" (Step S254).

Upon the receipt of the initialization completion data SD2 reset to "0", the CPU 1 recognizes the completion of the initialization simulation (Step S256). The CPU 1 reads the back-up data for the drive control data and the drive block history data from the RAM 31 and transmits these data to the CPU 2, and also transmits the operation control data, the IPU control data, and the reader history data as the back-up data successively to the CPU 2 (Step S258).

The above data are transmitted in the corresponding communication modes respectively. Specifically, the drive control data are transmitted in the simulation data transmission mode A, the drive block history data are transmitted in the history data transmission mode B (see TABLE-3). The operation control data, the IPU control data, and the reader history data are transmitted in the operation controller simulation data (see TABLE-3).

Upon the receipt of the drive control data, the drive block history data, the operation control data, the IPU control data, and the reader history data, the CPU 2 writes these data in the specified data area and back-up area or the RAM 37 (Step S260).

Upon the completion of the transmission of the reader history data, the CPU 1 judges that all the necessary data have been transmitted to the CPU 2 and finishes the control for the initialization simulation by the simulation code "702" (Step S262).

Figure 19:
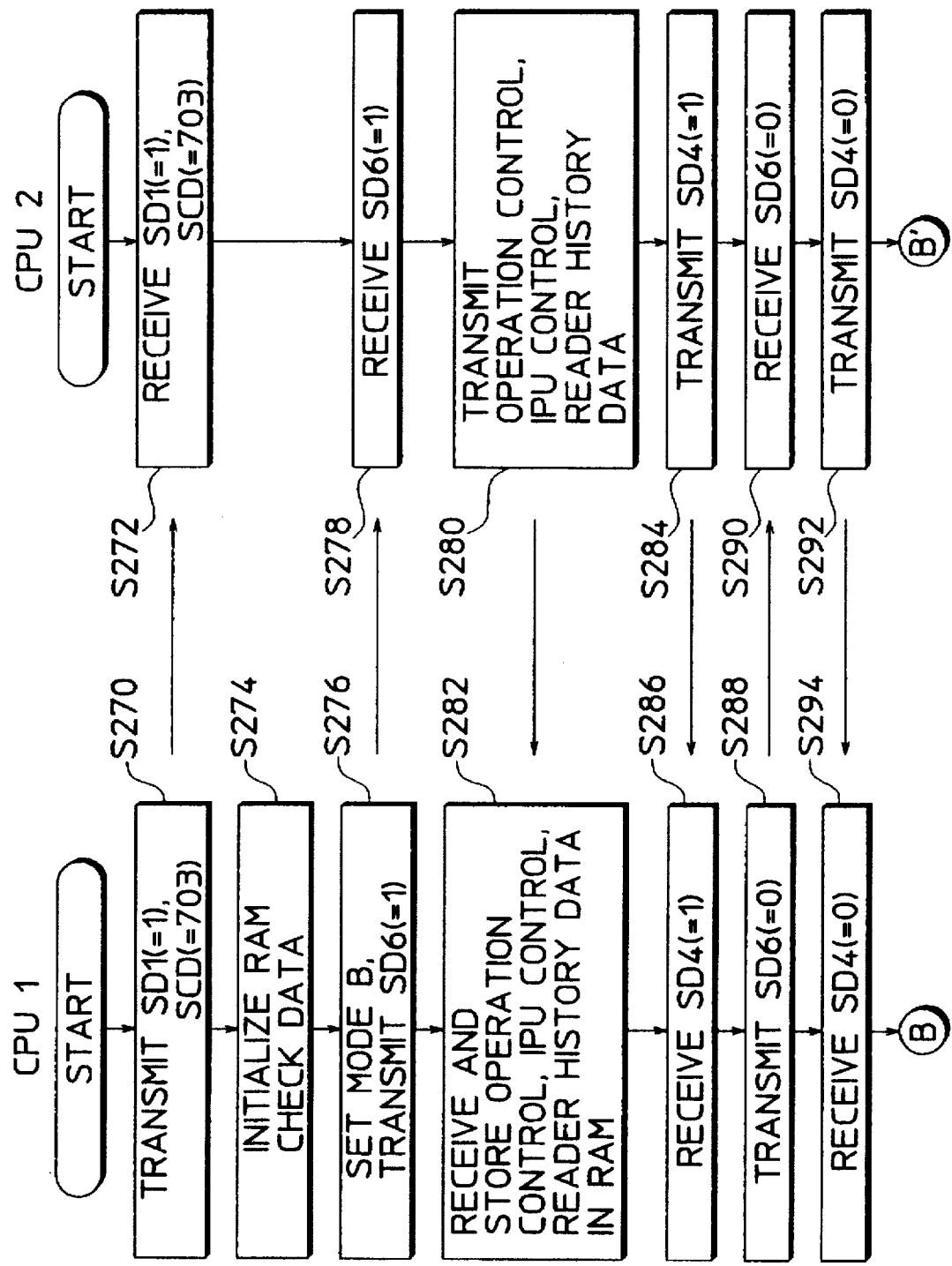

FIGS. 19, 20 are flow charts showing a control executed to carry out the initialization simulation by the simulation code "703".

When the initialization simulation by the simulation code "703" is started, the CPU 1 transmits to the CPU 2 the simulation execution data SD1 and the simulation code data SCD (=703) representing the type of the simulation code (Step S270). Upon the receipt of the simulation execution data SD1 and the simulation code data SCD, the CPU 2 recognizes the start of the execution of the initialization simulation by the simulation code "703" (Step S272).

Subsequently, the CPU 1 initializes the operation RAM check data by writing the check data CKD read from the ROM 36 or calculated using a specified operation expression in the specified check area ACK of the RAM 31 (Step S274). Upon the completion of this initialization, the CPU 1 sets the communication mode to the operation controller back-up data transmission mode B (see TABLE-3) and transmits an operation controller back-up data transmission requirement data SD6 to the CPU 2 (Step S276). The operation controller back-up data transmission requirement data SD6 is a flag data. For example, the data SD6 indicates the transmission requirement when set to "1", while indicating the cancellation of the transmission requirement when set to "0".

Upon the receipt of the operation controller back-up data transmission requirement data SD6 (Step S278), the CPU 2 reads the back-up data for the operation control data, the IPU control data, and the reader history data from the RAM 37 and transmits the same to the CPU 2 (Step S280). Upon the receipt of these data, the CPU 1 writes them in the specified back-up area of the RAM 31 (Step S282).

Subsequently, the operation controller back-up data transmission requirement data SD6 and the mode communication completion data SD4 are transmitted between the CPU 1 and the CPU 2 (Step S284 to S294), similarly to Steps S200 to S212 in FIG. 17. After recognizing the completion of the data communication in the operation controller back-up data transmission mode, the CPU 1 conducts the same communication as in Steps S194 to S232 with the CPU 2 (Step S296 to S334). During this communication, the CPU 1 receives the drive control data and the drive block history data and writes these data in the specified back-up area of the RAM 31.

Upon the receipt of the mode communication completion data SD4 reset to "0", the CPU 1 judges that the communication for the necessary back-up data has been completed (Step S334) and finishes the control for the initialization simulation by the simulation code "703" (Step S336).

FIG. 21 is a flow chart showing a control executed to carry out the initialization simulation by the simulation code "704".

When the initialization simulation by the simulation code "704" is started, the CPU 1 transmits to the CPU 2 the simulation execution data SD1 and the simulation code data SCD (=704) representing the type of the simulation code (Step S340).

Subsequently, the CPU 1 initializes the reader history data (Step S342). Since no back-up data for the reader history data is stored in the operation controller C1, a desired data, e.g., "0" is written as an initial value during this initialization.

Upon the receipt of the simulation execution data SDI and the simulation code data SCD, the CPU 2 recognizes the start of the execution of the initialization simulation by the simulation code "704" (Step S344) and initializes the drive block history data (Step S346). Since no back-up data for the drive block history data is stored in the drive controller C2, a desired data, e.g., "0" is written as an initial value during this initialization.

Upon the completion of the above initialization, the CPU 2 transmits the initialization completion data SD2 to the CPU 1 (Step S348). Upon the receipt of the initialization completion data SD2, the CPU 1 recognizes the completion of the initialization for the RAM 37 (Step S350) and transmits the simulation execution data SD1 to the CPU 2 after resetting it to "0" (Step S352). Upon the receipt of the simulation execution data SD1 reset to "0", the CPU 2 recognizes the completion of the execution of the simulation (Step S354) and transmits the initialization completion data SD2 to the CPU 1 after resetting it to "0" (Step S356).

Upon the receipt of the initialization completion data SD2 reset to "0", the CPU 1 judges that the initialization for the history data has been completed (Step S358) and finishes the control for the initialization simulation by the simulation code "704" (Step S360).

In the foregoing embodiments, the data restoration is described with respect to a case where the data stored in the operation controller C1 (or the drive controller C2) such as the control data and the history data are backed up in the drive controller C2 (or the operation controller C1). However, the invention is not limited to this case, but is also applicable in a case where, for example, the back-up data are stored in another storage medium.

For instance, the back-up data may be stored in a portable storage medium such as a floppy disk. When necessary, this portable storage medium is made available where the color digital copying machine 1 is installed. The back-up data are read from this storage medium using a special data reader and written in the RAMs 31, 37. When the copying machine 1 is provided with a communication function, the copying machine 1 may receive the back-up data stored in a host computer using this communication function and write these data in the RAMs 31, 37.

Further, the foregoing embodiments are described taking a color digital copying machine as an example. However, the invention is not limited to this, but is applicable to any control system provided that it is capable of carrying out various operations using the RAM.

As described above, according to the invention, each time an initialization is carried out, check data are generated and written in a part of a storage region of a memory. The written check data are read according to a check requirement made while the memory is driven and it is judged whether the read check data agree with the check data written in a part of the storage region. Accordingly, an abnormality in a reloadable memory resulting from a damage and a data distortion which occurs while the memory is driven can be detected promptly.

Particularly, the check data can be calculated using a specified operation expression in accordance with the addresses the check data are written. This eliminates the need to store the check data in a memory different from the reloadable memory, thereby enabling the memory to be used more efficiently.

The memory check is conducted when a predetermined check requirement condition is satisfied, e.g., each time a specified period elapses or an access is made a specified number of times. This results in a more reliable detection of the abnormality in the reloadable memory while this memory is driven.

Further, according to the invention, when the memory abnormality is detected by a memory checking device, the check data in the reloadable memory are initialized, and necessary data are read from a data storage means and written in this memory. In this way, the data in the memory are restored automatically. Thus, when the memory abnormality results not from the defect of the memory itself, but from the data distortion, the memory can be brought into a normal state easily and promptly without carrying out a cumbersome operation such as a replacement of the reloadable memory.

Although the present invention has been fully described by way of example with reference to the accompanying drawings, it is to be understood that various changes and modifications will be apparent to those skilled in the art. Therefore, unless such change and modifications depart from the scope of the invention, they should be construed as being included therein.

What is claimed is:

1. A device for checking a memory reloadable with operative data in connection with a specified operation, the device comprising:

check data generator means for generating check data;

writing means for writing the check data on a specified portion of the memory each time the memory is reloaded with operative data;

reading means for reading data from the specified portion of the memory after the reloading of operative data and the writing of the check data, the reading means including timer means for measuring a predetermined time after the reloading of operative data and writing of the check data, the reading means executing the reading of data from the specified portion of the memory after the lapse of the predetermined time; and judge means for judging whether the read data agrees with the generated check data.

2. A device for checking an abnormality of a memory operable to store operative data with which a specified operation is executed in accordance therewith, the device comprising:

check data generator means for generating check data for checking an abnormality of the memory;

writing means for writing the check data in a specified portion of the memory and the operative data in another portion of the memory so that the memory stores both the check data and the operative data;

reading means for reading the check data written in the memory during the time which the specified operation is executed in accordance with the operative data;

judge means for judging whether a read check data agrees with the generated check data generated by the check data generator means; and the reading means including timer means for measuring a predetermined time after the reloading of operative data and writing of the check data and the reading means further including means for executing the reading of data from the specified portion of the memory after the lapse of the predetermined time.

3. A device as defined as defined in claim 2 wherein the check data generator means includes a memory for storing predetermined check data.

4. A device as defined in claim 2 wherein the check data generator means includes means for generating check data on the basis of the address of the specified portion to be stored with the check data.

5. A device as defined in claim 2 wherein the reading means includes means for judging whether a predetermined step of the specified operation is completed, the reading means executing the reading of data from the specified portion of the memory after the predetermined step is completed.

* * * * *